(12) United States Patent
Chawla et al.

(10) Patent No.: US 10,957,844 B2
(45) Date of Patent: Mar. 23, 2021

(54) MAGNETO-ELECTRIC SPIN ORBIT (MESO) STRUCTURES HAVING FUNCTIONAL OXIDE VIAS

(71) Applicant: Intel Corporation, Santa Clara, CA (US)

(72) Inventors: Jasmeet S. Chawla, Beaverton, OR (US); Sasikanth Manipatruni, Hillsboro, OR (US); Robert L. Bristol, Portland, OR (US); Chia-Ching Lin, West Lafayette, IN (US); Dmitri E. Nikonov, Beaverton, OR (US); Ian A. Young, Portland, OR (US)

(73) Assignee: Intel Corporation, Santa Clara, CA (US)

( * ) Notice: Subject to any disclaimer, the term of this patent is extended or adjusted under 35 U.S.C. 154(b) by 149 days.

(21) Appl. No.: 16/346,872

(22) PCT Filed: Dec. 23, 2016

(86) PCT No.: PCT/US2016/068584
§ 371 (c)(1),
(2) Date: May 1, 2019

(87) PCT Pub. No.: WO2018/118091
PCT Pub. Date: Jun. 28, 2018

(65) Prior Publication Data
US 2019/0259935 A1    Aug. 22, 2019

(51) Int. Cl.
*H01L 43/02*    (2006.01)
*H01L 43/10*    (2006.01)
(Continued)

(52) U.S. Cl.
CPC .............. *H01L 43/02* (2013.01); *H01L 43/00* (2013.01); *H01L 43/10* (2013.01); *H01L 43/12* (2013.01); *H03K 19/18* (2013.01)

(58) Field of Classification Search
CPC combination set(s) only.
See application file for complete search history.

(56) References Cited

U.S. PATENT DOCUMENTS

2004/0108561 A1* 6/2004 Jeong .................. G11C 11/1673
                                                        257/422
2008/0239930 A1* 10/2008 Saito ....................... G11C 11/16
                                                        369/126
(Continued)

FOREIGN PATENT DOCUMENTS

WO    WO-2015-195122    12/2015
WO    WO-2016-105436    6/2016

OTHER PUBLICATIONS

International Search Report and Written Opinion for International Patent Application No. PCT/US2016/068584 dated Sep. 12, 2017, 11 pgs.
(Continued)

*Primary Examiner* — Mark W Tornow
*Assistant Examiner* — Priya M Rampersaud
(74) *Attorney, Agent, or Firm* — Schwabe, Williamson & Wyatt, P.C.

(57) ABSTRACT

Magneto-electric spin orbital (MESO) structures having functional oxide vias, and method of fabricating magneto-electric spin orbital (MESO) structures having functional oxide vias, are described. In an example, a magneto-electric spin orbital (MESO) device includes a source region and a drain region in or above a substrate. A first via contact is on the source region. A second via contact is on the drain region, the second via contact laterally adjacent to the first via contact. A plurality of alternating ferromagnetic material lines and non-ferromagnetic conductive lines is above the first and second via contacts. A first of the ferromagnetic material lines is on the first via contact, and a second of the ferromagnetic material lines is on the second via contact. A (Continued)

spin orbit coupling (SOC) via is on the first of the ferromagnetic material lines. A functional oxide via is on the second of the ferromagnetic material lines.

23 Claims, 12 Drawing Sheets

(51) Int. Cl.
   *H01L 43/12* (2006.01)
   *H01L 43/00* (2006.01)
   *H03K 19/18* (2006.01)

(56) References Cited

U.S. PATENT DOCUMENTS

| | | | |
|---|---|---|---|
| 2010/0072528 A1* | 3/2010 | Inokuchi | G11C 11/1693 257/295 |
| 2010/0073025 A1* | 3/2010 | Tanamoto | H03K 19/17764 326/41 |
| 2010/0219491 A1* | 9/2010 | Lee | H01F 10/329 257/421 |
| 2016/0042778 A1 | 2/2016 | Manipatruni et al. | |
| 2016/0225423 A1 | 8/2016 | Naik et al. | |
| 2016/0225890 A1* | 8/2016 | Datta | H01L 41/0986 |
| 2016/0276007 A1* | 9/2016 | Sugiyama | G11C 11/165 |
| 2016/0336508 A1* | 11/2016 | Guo | H01L 43/08 |

OTHER PUBLICATIONS

International Preliminary Report on Patentability for International Patent Application No. PCT/US2016/068584 dated Jul. 4, 2019, 8 pgs.

* cited by examiner

MAGNETO-ELECTRIC SPIN ORBIT (MESO) STRUCTURES HAVING FUNCTIONAL OXIDE VIAS

CROSS-REFERENCE TO RELATED APPLICATION

This patent application is a U.S. National Phase Application under 35 U.S.C. § 371 of International Application No. PCT/US2016/068584, filed Dec. 23, 2016, entitled "MAGNETO-ELECTRIC SPIN ORBIT (MESO) STRUCTURES HAVING FUNCTIONAL OXIDE VIAS," which designates the United States of America, the entire disclosure of which is hereby incorporated by reference in its entirety and for all purposes.

TECHNICAL FIELD

Embodiments of the disclosure are in the field of semiconductor structures and processing and, in particular, magneto-electric spin orbital (MESO) structures having functional oxide vias, and method of fabricating magneto-electric spin orbital (MESO) structures having functional oxide vias.

BACKGROUND

For the past several decades, the scaling of features in integrated circuits has been a driving force behind an ever-growing semiconductor industry. Scaling to smaller and smaller features enables increased densities of functional units on the limited real estate of semiconductor chips. For example, shrinking transistor size allows for the incorporation of an increased number of memory or logic devices on a chip, lending to the fabrication of products with increased capacity. The drive for ever-more capacity, however, is not without issue. The necessity to optimize the performance of each device becomes increasingly significant.

Non-volatile logic may be necessary for lowering power dissipation of integrated circuits by more efficient sleep states when the circuit is idle. However, improvements are needed to enable non-volatile logic with switching energy and delay approaching those for conventional logic circuits.

DESCRIPTION OF THE EMBODIMENTS

Figure 1A:
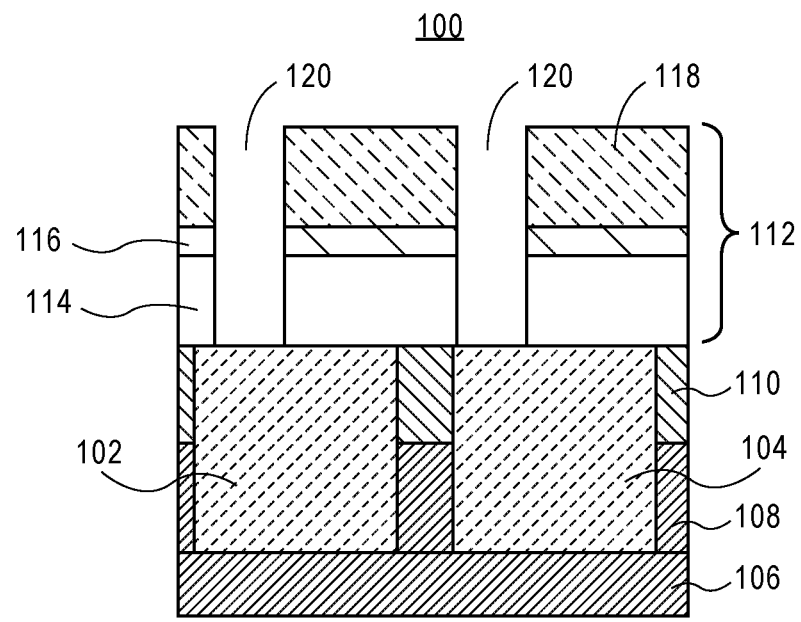
FIGS. 1A-1J illustrate cross-sectional views representing various operations in a method of fabricating a MESO device having a functional oxide via, in accordance with an embodiment of the present disclosure.

Magneto-electric spin orbital (MESO) structures having functional oxide vias, and method of fabricating magneto-electric spin orbital (MESO) structures having functional oxide vias, are described. In the following description, numerous specific details are set forth, such as specific integration and material regimes, in order to provide a thorough understanding of embodiments of the present disclosure. It will be apparent to one skilled in the art that embodiments of the present disclosure may be practiced without these specific details. In other instances, well-known features, such as integrated circuit design layouts, are not described in detail in order to not unnecessarily obscure embodiments of the present disclosure. Furthermore, it is to be understood that the various embodiments shown in the Figures are illustrative representations and are not necessarily drawn to scale.

Certain terminology may also be used in the following description for the purpose of reference only, and thus are not intended to be limiting. For example, terms such as "upper," "lower," "above," "below," "bottom," and "top" refer to directions in the drawings to which reference is made. Terms such as "front," "back," "rear," and "side" describe the orientation and/or location of portions of the component within a consistent but arbitrary frame of reference which is made clear by reference to the text and the associated drawings describing the component under discussion. Such terminology may include the words specifically mentioned above, derivatives thereof, and words of similar import.

One or more embodiments described herein is directed to fabrication approaches for forming magneto-electric spin orbit (AMESO) logic, and the resulting structures and devices. Particular embodiments are directed to the use of photo-buckets for processing functional oxide vias for fabricating magneto-electric spin orbit (MESO) logic structures and devices.

To provide context, energy efficient non-volatile spin logic belongs to a class of devices utilizing a new physical quantity (e.g., magnetization or spin (spintronic logic)) as a computation variable. Such new variables can be non-volatile, i.e., preserving the computation state when the power to the integrated circuit is switched off. Non-volatile logic can improve the power and computational efficiency by allowing architects to put the processor to un-powered sleep states more often with less energy. However existing spintronic logic options suffer from high energy and long time necessary for switching due to the inefficiency of mechanism for converting charge to spin variables and vice versa. In particular this results in (1) large write currents (e.g., approximately 100 µA/bit) producing high Joule heat dissipation, and/or (2) slow switching time (e.g., approximately 10 ns) over which the current needs to be "on".

As an example of a prior implementation, an "all spin logic" employing spin currents involves the use of spin polarized current as conducted between nanomagnets to switch magnetization by the spin torque effect. In such a spintronic device, the signal is sent from one node to the other as a spin quantity (spin polarized current, a domain wall, or a spin wave). The signals are slow (e.g., approximately 1000 m/s) and, more importantly, they may exponentially attenuate over the length of approximately 1 um. By contrast, in accordance with an embodiment of the present disclosure, the signal is sent over an electrical interconnect in a MESO device. In one such embodiment, the charge current does not attenuate and the communication is relatively much faster (e.g., as limited by the RC delay).

To provide further context, in a spintronic device, current induced injection of spin current from a magnet is used as the charge-to-spin conversion. Spin torque is used to switch magnetization in an output magnet. The effect of magnetoresistance as detected by a sense amplifier is used as the spin-charge conversion. By contrast, in accordance with an embodiment of the present disclosure, due to much more efficient conversion mechanisms in a MESO device, the switching time of the devices is approximately 100 ps versus approximately 1ns for a spintronic device. In one embodiment, a MESO device has a switching energy of approximately 10 aJ versus approximately 100 fJ for a spintronic device.

In accordance with one or more embodiments of the present disclosure, devices based on injection mechanism and spin to charge conversion are described. For example, an input nanomagnet injects a spin polarized current into a high spin-orbit coupling (SOC) material stack. The spin polarization is determined by the magnetization of the input magnet. The injection stack includes an interface with a high density two-dimensional (2D) electron gas and with high SOC such as silver/bismuth (Ag/Bi), or a bulk material with high Spin Hall Effect (SHE) coefficient such as tantalum (Ta), tungsten (W), or platinum (Pt). In a particular embodiment, a silver or copper spacer is included between the nanomagnet and the injection stack.

In an exemplary processing scheme, a via first, lines next approach is implemented. As an example, FIGS. 1A-1J illustrate cross-sectional views representing various operations in a method of fabricating a MESO device having a functional oxide via, in accordance with an embodiment of the present disclosure.

Referring to FIG. 1A, a starting structure 100 includes a source structure 102 and a drain structure 104 above a substrate 106 and in an inter-layer dielectric (ILD) layer 108 which may include a hardmask 110. An upper stack 112 includes a second ILD layer 114. A second hardmask 116 and a patterning layer 118 may also be included above ILD layer 114, as is shown.

Source structure 102 and drain structure 104 may be semiconductor or conductive features formed above a substrate, or may be semiconductor regions formed in or on a semiconductor substrate or body. ILD layers 108 and 114 may be ILD layers such as those described below. Hardmask layers 110 and 116 may be hardmask layers such as those described below. Patterning layer 118 may be a photoresist layer or a patterning stack, examples of which are described below.

Openings 120 are formed in upper stack 112. Openings 120 expose portions of source structure 102 and drain structure 104. Openings 120 may be formed using a lithographic approach such as a lithographic approach describe below. In one embodiment, a pattern of numerous openings is formed above ILD layer 114, possibly in or above one or both of the second hardmask 116 or the patterning layer 118. A sub-set of openings of the pattern of openings is then selected (opened) using a photobucket approach such as a photobucket approach described below. In one embodiment, the photobucket approach provides via contact openings to source structure 102 and to drain structure 104 in select locations.

Figure 1B:
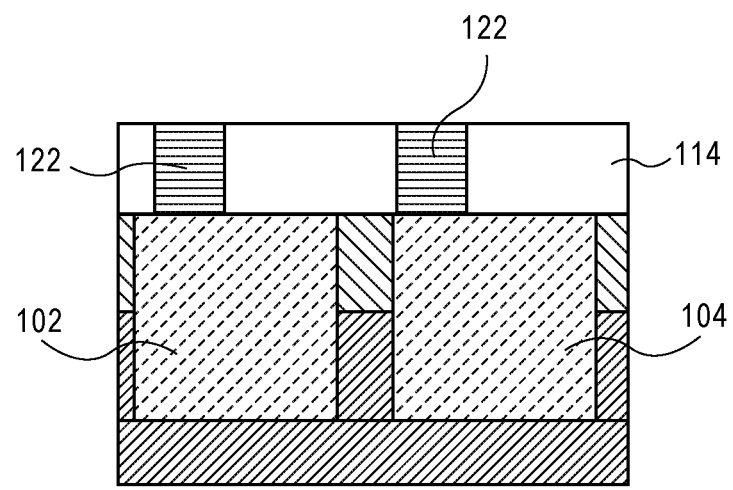

Referring to FIG. 1B, via contacts 122 are formed in openings 120 of second ILD layer 114. In one embodiment, a first via contact 122 (left-hand-side) is electrically coupled to source structure 102, and a second via contact 122 (right-hand side) drain structure 104. In one embodiment, via contacts 122 are conductive via structures such as described below. In one embodiment, via contacts 122 are formed by filling openings 120 with a conductive material or materials and then planarizing the resulting structure. In one such embodiment, the hardmask 116 and patterning layer 118 are removed during the planarization process to leave via contacts 122 remaining in second ILD layer 114. In an embodiment, in the case that openings 120 are formed using a photobucket approach (which may be a first photobucket approach in the present processing scheme), first and second via contacts 122 are formed using a photobucket approach in a sacrificial hardmask layer formed above the second dielectric layer 114.

Figure 1C:
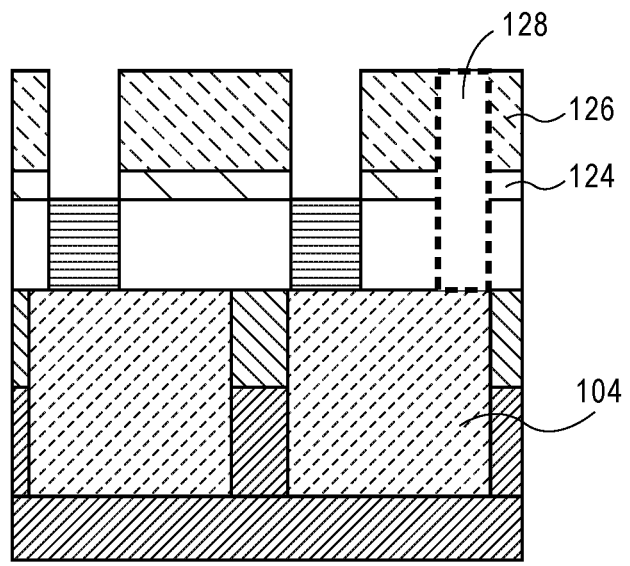

Referring to FIG. 1C, a third hardmask layer 124 and second patterning layer or stack 126 are formed above the structure of FIG. 1B. An opening 128 is formed in the third hardmask layer 124 and second patterning layer or stack 126. Opening 128 exposes a second portion of drain structure 104, such as a portion into the page, as represented by the dashed lines to indicate that the opening 128 is further back into the page relative to via contacts 122.

Opening 128 may be formed using a lithographic approach such as a lithographic approach describe below. In one embodiment, a pattern of numerous openings is formed above ILD layer 114, possibly in or above one or both of the third hardmask layer 124 or the second patterning layer or stack 126. A sub-set of openings (or one opening) of the pattern of openings is then selected (opened) using a photobucket approach, such as a photobucket approach described below. In one embodiment, the photobucket approach provides an additional via contact openings to drain structure 104 in a select location.

Figure 1D:
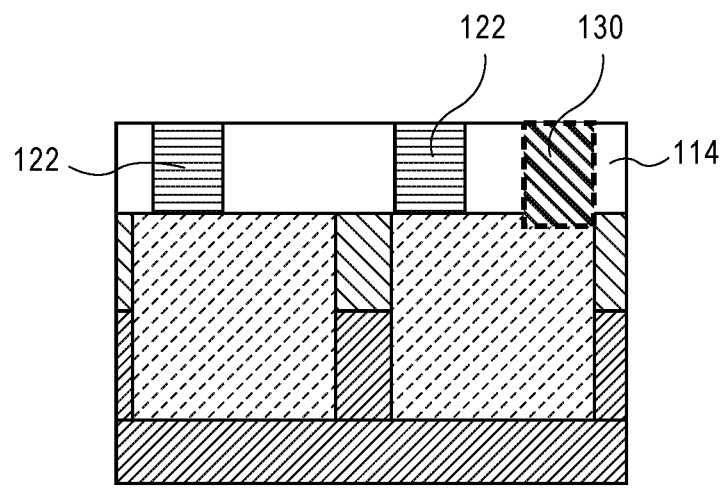

Referring to FIG. 1D, a via contact 130 is formed in opening 128 of second ILD layer 114. In one embodiment, via contact 130 is electrically coupled to drain structure 104, such as to a portion of drain structure 104 that is into the page, as represented by the dashed lines to indicate that the via contact 130 is further back into the page relative to via contacts 122. In one embodiment, via contact 130 is a conductive via structure such as described below. In one embodiment, via contact 130 is formed by filling opening 128 with a conductive material or materials and then planarizing the resulting structure. In one such embodiment, the third hardmask 124 and second patterning layer 126 are removed during the planarization process to leave via contact 130 remaining in second ILD layer 114. In an embodiment, in the case that opening 128 is formed using a photobucket approach (which may be a second photobucket approach in the present processing scheme), via contact 130 is formed using a photobucket approach in a sacrificial hardmask layer formed above the second dielectric layer 114.

Figure 1E:
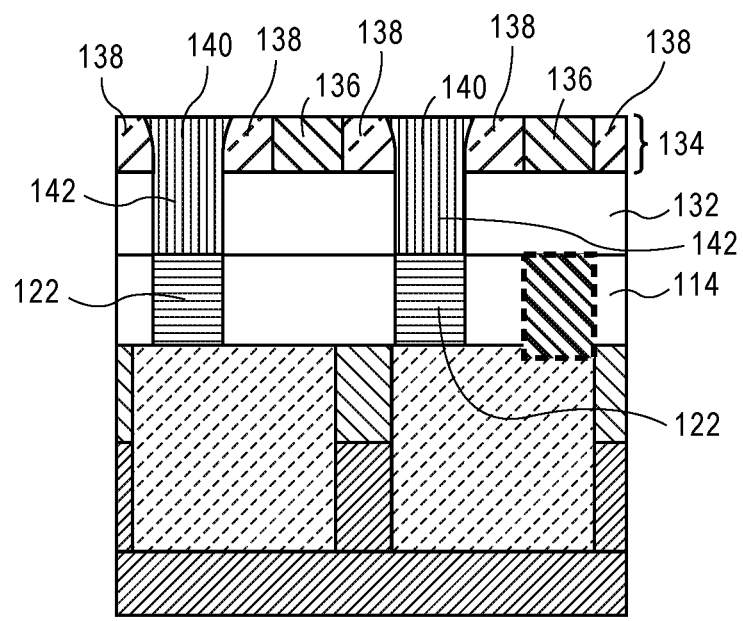

Referring to FIG. 1E, a third ILD layer 132 is formed on or above (if spaced by etch stop layer) second ILD 114. A dual hardmask layer 134 is formed above the third ILD layer 132. In an embodiment, dual hardmask layer 134 includes alternating hardmask types (e.g., of differing etch selectivity) of a first hardmask type 136 and a second hardmask type 138. In the example shown, select ones of the first hardmask type 136 are then opened (removed) in locations 140, e.g., by a lithographic and etch process. The openings in dual hardmask layer 134 are then extended into the third ILD layer 132. In one such embodiment, the extended openings at locations 140 expose via contacts 122. Ferromagnetic material 142 is then formed in the openings at locations 140, e.g., by a deposition and planarization process.

In an embodiment, "pitch division" is used to fabricate the dual hardmask layer 134. In one such embodiment, a tight pitch that is not achievable directly through conventional lithography is achieved using pitch division. For example, a pattern based on conventional lithography may first be formed, but the pitch may be halved by the use of spacer mask patterning, as is known in the art. Even further, the original pitch may be quartered by a second round of spacer mask patterning. Accordingly, grating-like patterns may be fabricated to provide hardmask lines spaced at a constant pitch and having a constant width. The pattern may be fabricated by a pitch halving or pitch quartering approach.

In an embodiment, ferromagnetic material 142 is a material such as, but not limited to, Co, Fe, Ni, Gd or their alloys. In an embodiment, ferromagnetic material 142 is a material such as, but not limited to, Huesler alloy of the form $X_2YZ$ or XYZ where X, Y, Z are elements of Co, Fe, Ni, Al, Ge, Ga, Gd, and Mn, etc.

Figure 1F:
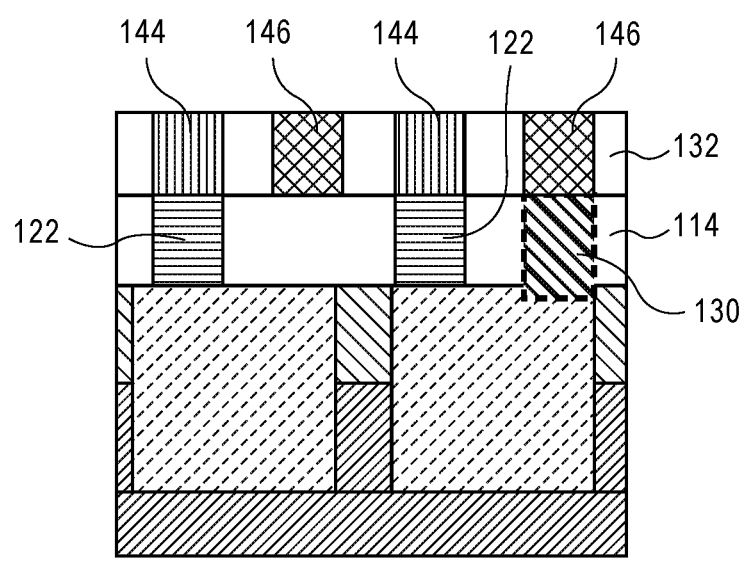

Referring to FIG. 1F, remaining ones of the first hardmask type 136 of the dual hardmask layer 134 are then opened (removed), e.g., by a selective etch process. This second set of openings in dual hardmask layer 134 are then extended into the third ILD layer 132. In one such embodiment, one of the extended openings exposes via contact 130. Conductive material (such as conductive interconnect material) is then formed in the second set of openings, e.g., by a deposition and planarization process. In one embodiment, the conductive material includes a material selected from the group consisting of Cu, Rh, Co, Ru, Al, Ag, and a silicide. In one embodiment, the conductive material is a non-ferromagnetic conductive material.

The resulting structure is then planarized to remove material above the third ILD material 132 and to confine the ferromagnetic material and the non-ferromagnetic conductive material to the third ILD layer 132, providing a plurality of alternating ferromagnetic material structures 144 and conductive structures 146 (which may be referred to as non-ferromagnetic conductive structures 146). In one such embodiment, a first of the ferromagnetic material structures 144 is formed on a first of the via contacts 122, a second of the ferromagnetic material structures 144 is formed on a second of the via contacts 122, and one of the non-ferromagnetic conductive structures 146 is coupled to the via contact structure 130. In one embodiment, the third ILD layer 132 is patterned with a plurality of trenches, and the corresponding plurality of alternating ferromagnetic material structures 144 and non-ferromagnetic conductive structures 146 is a plurality of alternating ferromagnetic material lines 144 and non-ferromagnetic conductive lines 146.

Figure 1G:
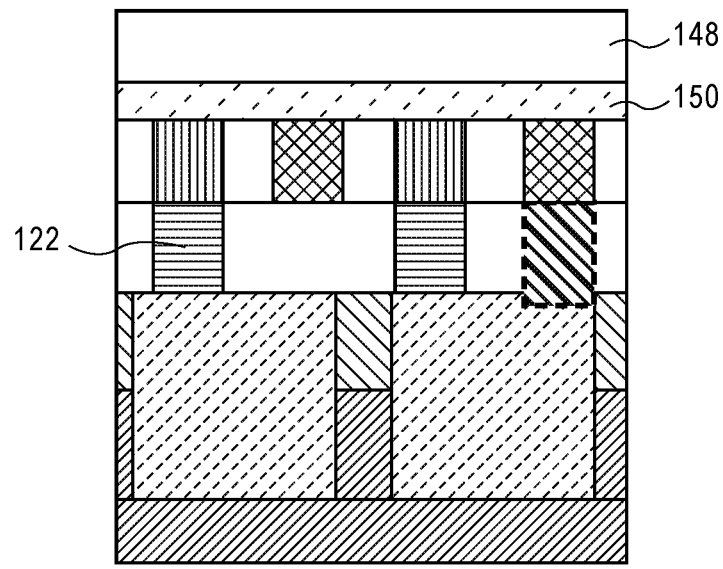

Referring to FIG. 1G, a fourth ILD layer 148 is formed above the structure of FIG. 1F. An etch stop layer 150 may also be formed, where the fourth ILD layer 148 is formed on the etch stop layer 150.

Figure 1H:
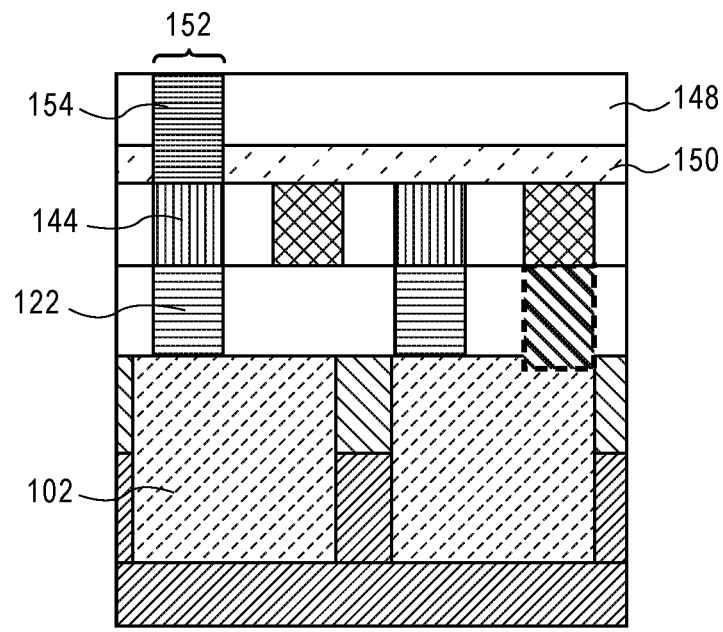

Referring to FIG. 1H, an opening 152 is formed in the fourth hardmask layer 148 and, if present, in the etch stop layer 150. Opening 152 exposes the ferromagnetic structure 144 on the via contact 122 coupled to the source structure 102. Opening 152 may be formed using a lithographic approach such as a lithographic approach describe below. In one embodiment, a pattern of numerous openings is formed above fourth ILD layer 148. A sub-set of openings (or one opening) of the pattern of openings is then selected (opened) using a photobucket approach, such as a photobucket approach described below.

Referring again to FIG. 1H, a spin orbit coupling (SOC) via 154 is formed in opening 152 formed in fourth ILD layer 148. In one embodiment, the SOC via 154 is formed on and in contact with the ferromagnetic material structure 144 formed on via contact 122 formed on source structure 102. In one embodiment, SOC via 154 is formed by filling opening 152 with an SOC material or material stack and then planarizing the resulting structure to leave SOC via 154 remaining in fourth ILD layer 148. In an embodiment, in the case that opening 152 is formed using a photobucket approach (which may be a third photobucket approach in the present processing scheme), SOC via 154 is formed using a photobucket approach in a sacrificial hardmask layer formed above the fourth dielectric layer 148.

In an embodiment, SOC via 154 includes a non-magnetic metal material such as silver (Ag), aluminum (Al), gold (Au) or copper (Cu) connected to a spin orbit coupling (SOC) material that is a material or materials that will exhibit a spin orbit effect in a metallic system. Representative material for spin orbit coupling material include an element of group V of the Periodic Table of Elements and their alloys (e.g., bismuth, bismuth-silver alloys) or traditional interconnect materials (copper (Cu), gold (Au), silver (Ag), aluminum (Al) doped with the high atomic weight transition elements that will produce a strong or high spin orbit coupling (SOC) at the interface of the metal material and the spin orbit coupling material on the order of 0.01 nanometers (nm) to 100 nm, or a bulk material with high spin Hall effect (SHE) coefficient (e.g., on the order of 0.01 to 10 or greater (e.g., 0.1 to 1)) such as tantalum (Ta), tungsten (W), or platinum (Pt), or high atomic weight transition elements such as lutetium (Lu), hafnium (Hf), rhodium (Rh), osmium (Os), iridium (Ir), gold (Au), mercury (Hg). In the embodiment, the non-magnetic material is disposed on the spin orbit coupling material with an interface there between. In one embodiment, the interface of the non-magnetic metal material and the spin orbit coupling material is a high density two-dimensional electron gas where charge and spin currents are correlated. In one embodiment, a spacer is included such as a non-magnetic material (e.g., silver or copper) spacer at the top of the spin orbit effect stack.

Figure 1I:
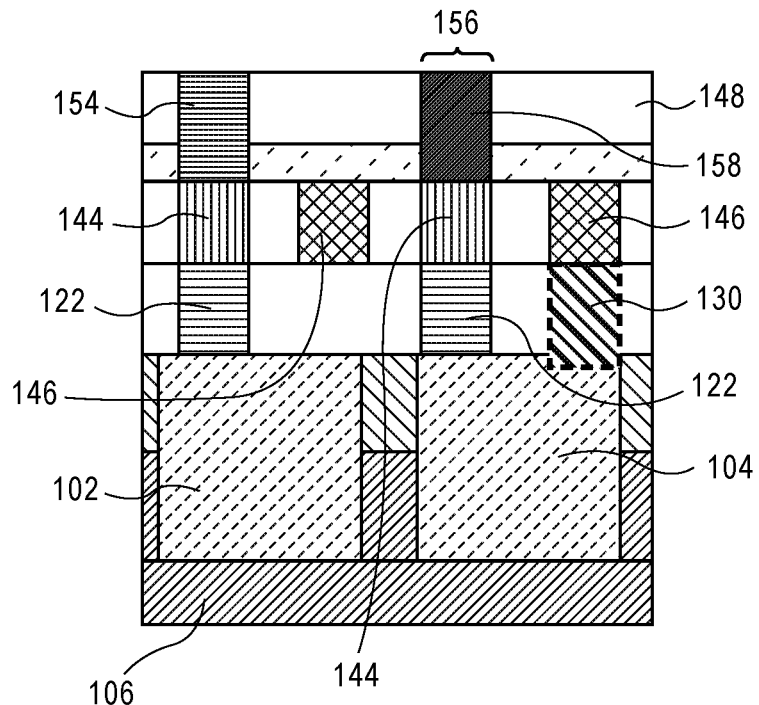

Referring to FIG. 1I, an opening 156 is formed in the fourth hardmask layer 148 and, if present, in the etch stop layer 150. Opening 156 exposes the ferromagnetic structure 144 on the via contact 122 coupled to the drain structure 104. Opening 156 may be formed using a lithographic approach such as a lithographic approach describe below. In one embodiment, a pattern of numerous openings is formed above fourth ILD layer 148. A sub-set of openings (or one opening) of the pattern of openings is then selected (opened) using a photobucket approach, such as a photobucket approach described below.

Referring again to FIG. 1, a functional oxide via 158 is formed in opening 156 formed in fourth ILD layer 148. In one embodiment, the functional oxide via 158 is formed on and in contact with the ferromagnetic material structure 144 formed on via contact 122 formed on drain structure 104. In one embodiment, functional oxide via 158 is formed by filling opening 156 with a functional oxide material and then planarizing the resulting structure to leave functional oxide via 158 remaining in fourth ILD layer 148. In an embodiment, in the case that opening 156 is formed using a photobucket approach (which may be a fourth photobucket approach in the present processing scheme), functional oxide via 158 is formed using a photobucket approach in a sacrificial hardmask layer formed above the fourth dielectric layer 148.

In an embodiment, the functional oxide via structure 158 is a magnetoelectric dielectric material such as, but not limited to, bismuth ferrite (BFO), chromium (III) oxide ($Cr_2O_3$) or magnesium oxide (MgO). In one embodiment, the functional oxide via structure 158 is a single material that directly produces a magnetoelectric effect. In another embodiment, the functional oxide via structure 158 is a combination of materials such as multiple layers of oxides and intermetallics that define a dielectric stack. Such combination of materials may achieve a magnetoelectric effect through, for example, cascading of two transductions or physical phenomena in materials (e.g, cascading of a voltage to strain transduction and a strain to magnetization transduction).

Figure 1J:
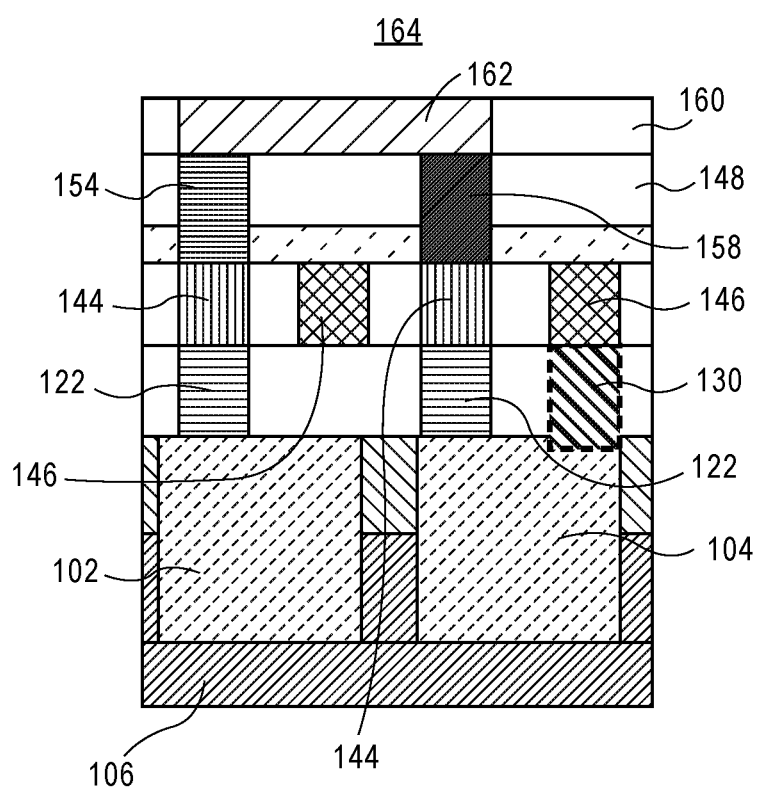

Referring to FIG. 1J, a fifth ILD layer 160 is formed on or above (if spaced by etch stop layer) the fourth ILD layer 148. An interconnect line 162 is formed in fifth ILD layer 160, e.g., by damascene approach. In an embodiment, interconnect line 162 couples SOC via 154 and functional oxide via 158. In one embodiment, interconnect line 162 is formed in a trench in fifth ILD layer 160 that runs orthogonal to the non-ferromagnetic conductive lines 146. In an embodiment, the fabrication of interconnect line 162 coupling SOC via 154 and functional oxide via 158 provides a MESO structure or device 164.

It is to be appreciated that the above described process for fabrication of a MESO device or structure may include additional fabrication processes such as lithography, etch, thin films deposition, planarization (such as chemical mechanical polishing (CMP)), diffusion, metrology, the use of sacrificial layers, the use of etch stop layers, the use of planarization stop layers, and/or any other actions associated with microelectronic component fabrication. It is also to be appreciated that the operations described above may be performed in an order different than the order described above, or one or more operations described above may be omitted from a process flow.

Figure 2:
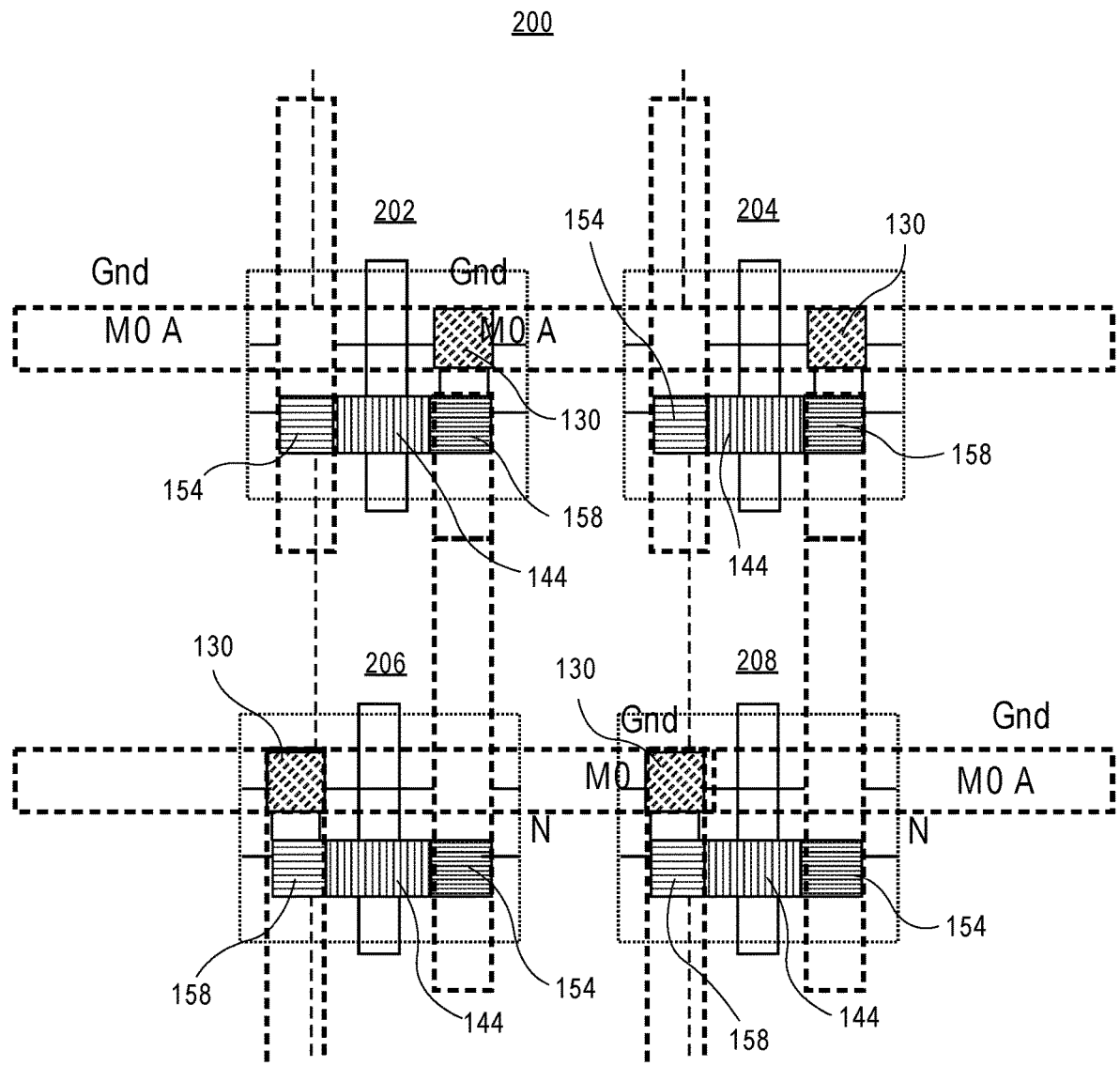
FIG. 2 is a schematic layout of a MESO device having a functional oxide via, in accordance with an embodiment of the present disclosure.

In an exemplary arrangement of MESO structures, FIG. 2 is a schematic layout of a MESO device having a functional oxide via, in accordance with an embodiment of the present disclosure.

Referring to FIG. 2, a layout 200 of four MESO structures 202, 204, 206 and 208 are shown as coupled together. Layout 200 is labeled to highlight possible locations of ferromagnetic structures 144, via contacts 130, SOC via structures 154, and functional oxide via structure 158. In an embodiment, the layout 200 provides an arrangement where a bottom electrode forms a three-terminal device.

The structure of FIG. 1J or FIG. 2 may subsequently be used as a foundation for forming subsequent metal line/via and ILD layers. Alternatively, the structure of FIG. 1J or FIG. 2 may represent the final structure in an integrated circuit. In an embodiment where photobuckets are used to form one or more of the above described vias, offset due to conventional lithograph/damascene patterning that must otherwise be tolerated, is not a factor for the resulting structures described herein.

In an embodiment, as used throughout the present description, interlayer dielectric (ILD) material is composed of or includes a layer of a dielectric or insulating material. Examples of suitable dielectric materials include, but are not limited to, oxides of silicon (e.g., silicon dioxide ($SiO_2$)), doped oxides of silicon, fluorinated oxides of silicon, carbon doped oxides of silicon, various low-k dielectric materials known in the arts, and combinations thereof. The interlayer dielectric material may be formed by conventional techniques, such as, for example, chemical vapor deposition (CVD), physical vapor deposition (PVD), or by other deposition methods.

In an embodiment, as is also used throughout the present description, metal lines, non-ferromagnetic lines, or interconnect line material (and via contact material) is composed of one or more metal or other conductive structures. A common example is the use of copper lines and structures that may or may not include barrier layers between the copper and surrounding ILD material. As used herein, the term metal includes alloys, stacks, and other combinations of multiple metals. For example, the metal interconnect lines may include barrier layers (e.g., layers including one or more of Ta, TaN, Ti or TiN), stacks of different metals or alloys, etc. Thus, the interconnect lines may be a single material layer, or may be formed from several layers, including conductive liner layers and fill layers. Any suitable deposition process, such as electroplating, chemical vapor deposition or physical vapor deposition, may be used to form interconnect lines. In an embodiment, the interconnect lines are composed of a conductive material such as, but not limited to, Cu, Al, Ti, Zr, Hf, V, Ru, Co, Ni, Pd, Pt, W, Ag, Au or alloys thereof. The interconnect lines are also sometimes referred to in the art as traces, wires, lines, metal, or simply interconnect.

In an embodiment, as is also used throughout the present description, hardmask materials and/or etch stop layers are composed of dielectric materials different from the interlayer dielectric material. In one embodiment, different hardmask materials may be used in different regions so as to provide different growth or etch selectivity to each other and to the underlying dielectric and metal layers. In some embodiments, a hardmask layer includes a layer of a nitride of silicon (e.g., silicon nitride) or a layer of an oxide of silicon, or both, or a combination thereof. Other suitable materials may include carbon-based materials. In another embodiment, a hardmask material includes a metal species. For example, a hardmask or other overlying material may include a layer of a nitride of titanium or another metal (e.g., titanium nitride). Potentially lesser amounts of other materials, such as oxygen, may be included in one or more of these layers. Alternatively, other hardmask layers known in the arts may be used depending upon the particular implementation. The hardmask layers maybe formed by CVD, PVD, or by other deposition methods.

In an embodiment, as is also used throughout the present description, lithographic operations are performed using 193 nm immersion litho (i193), EUV and/or EBDW lithography, or the like. A positive tone or a negative tone resist may be used. In one embodiment, a lithographic mask is a trilayer mask composed of a topographic masking portion, an anti-reflective coating (ARC) layer, and a photoresist layer. In a particular such embodiment, the topographic masking portion is a carbon hardmask (CHM) layer and the anti-reflective coating layer is a silicon ARC layer.

It is to be appreciated that the layers and materials described above are typically formed on or above an underlying semiconductor substrate or structure, such as underlying device layer(s) of an integrated circuit. In an embodiment, an underlying semiconductor substrate represents a general workpiece object used to manufacture integrated circuits. The semiconductor substrate often includes a wafer or other piece of silicon or another semiconductor material. Suitable semiconductor substrates include, but are not limited to, single crystal silicon, polycrystalline silicon and silicon on insulator (SOI), as well as similar substrates formed of other semiconductor materials. The semiconductor substrate, depending on the stage of manufacture, often includes transistors, integrated circuitry, and the like. The substrate may also include semiconductor materials, metals, dielectrics, dopants, and other materials commonly found in semiconductor substrates. Furthermore, the structures depicted above may be fabricated on underlying lower level back end of line (BEOL) interconnect layers.

With respect to one or more of the above described vias, the sizes and the spacing of vias has progressively decreased, and it is expected that in the future the sizes and the spacing of the vias will continue to progressively decrease, for at least some types of integrated circuits (e.g., advanced microprocessors, chipset components, graphics chips, etc.). One measure of the size of the vias is the critical dimension of the via opening. One measure of the spacing of the vias is the via pitch. Via pitch represents the center-to-center distance between the closest adjacent vias.

When patterning extremely small vias with extremely small pitches by conventional lithographic processes, several challenges present themselves, especially when the pitches are around 70 nanometers (nm) or less and/or when the critical dimensions of the via openings are around 35 nm or less. One such challenge is that the overlay between the vias and the overlying structures, and the overlay between the vias and the underlying landing structures, generally need to be controlled to high tolerances on the order of a quarter of the via pitch. As via pitches scale ever smaller over time, the overlay tolerances tend to scale with them at an even greater rate than lithographic equipment is able to keep up.

Another such challenge is that the critical dimensions of the via openings generally tend to scale faster than the resolution capabilities of the lithographic scanners. Shrink technologies exist to shrink the critical dimensions of the via openings. However, the shrink amount tends to be limited by the minimum via pitch, as well as by the ability of the shrink process to be sufficiently optical proximity correction (OPC) neutral, and to not significantly compromise line width roughness (LWR) and/or critical dimension uniformity (CDU). Yet another such challenge is that the LWR and/or CDU characteristics of photoresists generally need to improve as the critical dimensions of the via openings decrease in order to maintain the same overall fraction of the critical dimension budget. However, currently the LWR and/or CDU characteristics of most photoresists are not improving as rapidly as the critical dimensions of the via openings are decreasing. A further such challenge is that the extremely small via pitches generally tend to be below the resolution capabilities of even extreme ultraviolet (EUV) lithographic scanners. As a result, commonly two, three, or more different lithographic masks may be used, which tend to increase the costs. At some point, if pitches continue to decrease, it may not be possible, even with multiple masks, to print via openings for these extremely small pitches using EUV scanners.

To provide context further, current fabrication techniques for vias involves a "blind" process in which a via opening is patterned in a stack far above an ILD trench. The via opening pattern is then etched deep down into the trench. Overlay errors accumulate and can cause various problems, e.g., shorts to neighboring metal lines. In an example, patterning and aligning of features at less than approximately 50 nanometer pitch requires many reticles and critical alignment strategies that are otherwise extremely expensive for a semiconductor manufacturing process. In an embodiment, by contrast, approaches described herein enable fabrication of self-aligned via openings, greatly simplifying the web of overlay errors.

Applications of approaches described herein may be implemented to create regular structures covering all possible via locations, followed by selective patterning of only the desired features. More specifically, one or more embodiments described herein involves the use of a subtractive method to pre-form every via or via opening using the trenches already etched. An additional operation is then used to select which of the vias and to retain. As described above, such operations can be illustrated using "photobuckets," although the selection process may also be performed using a more conventional resist expose and ILD backfill approach.

In an embodiment, implementation of a photobucket approach involves use of a lithography exposure to select certain one of the photobuckets. In an embodiment, the lithography exposure involves exposing the structure to extreme ultraviolet (EUV) or e-beam radiation. In an embodiment, the EUV or e-beam radiation has a wavelength approximately 13.5 nanometers. In another embodiment, exposing the structure to extreme ultraviolet (EUV) or e-beam radiation includes exposing the structure to energy in the range of 5-150 keV. In an embodiment, exposing the structure to UV radiation includes exposing the structure to energy having a wavelength approximately 365 nanometers or approximately 193 nanometers. In an embodiment, the lithography exposure involves use of a relatively large exposure window without the risk of mis-alignment of selection of unwanted photobucket locations.

In an embodiment, subsequent to the lithography exposure, implementation of a photobucket approach involves a bake operation. In one such embodiment, the bake is performed at a temperature approximately in the range of 50-120 degrees Celsius for a duration of approximately in the range of 0.5-5 minutes.

A development process may then be implemented to clear the exposed or selected photobucket(s) In an embodiment, developing the photobuckets includes, in the case of positive tone development, immersion or coating with standard aqueous TMAH developer (e.g., in a concentration range from 0.1 M-1 M) or other aqueous or alcoholic developer based on tetraalkylammonium hydroxides for 30-120 seconds followed by rinse with deionized (DI) water. In another embodiment, developing the photobuckets includes, in the case of negative tone development, immersion or coating with organic solvents such as cyclohexanone, 2-heptanone, propylene glycol methylethyl acetate or others followed by rinse with another organic solvent such as hexane, heptane, cyclohexane or the like.

An etch process may then be used to form openings in an underlying dielectric layer, where the openings represent eventual via locations, such as locations for via contact 122, via contact 130, SOC via 154, or function oxide via 158. Accordingly, the etch process may complete a via selection process based on selection and removal of one or more photobuckets.

In another aspect, the operation of fabricated MESO devices such as those described above in association with FIG. 1J and FIG. 2 is disclosed. In accordance with an embodiment of the present disclosure, the spin-orbit mechanism responsible for spin to charge conversion is described by the Rashba effect in two-dimensional (2D) electron gases. The Hamiltonian (energy) of spin-orbit coupling electrons in a 2D electron gas is provided in Equation (1).

$$H_R = \alpha_R (k \times \hat{z}) \cdot \sigma^1 \tag{1}$$

Spin polarized electrons with direction of polarization in-plane (in the xy-plane) experience an effective magnetic field dependent on the spin direction, according to Equation (2).

$$\vec{B}(k) = \frac{\alpha_R}{\mu_B}\left(\vec{k} \times \hat{z}\right) \quad (2)$$

This results in the generation of a charge current in the interconnect proportional to the spin current. The spin-orbit interaction such as at a silver/bismuth (Ag/Bi) interface (the Inverse Rashba-Edelstein Effect (IREE)) produces a charge current in the horizontal direction according to Equation (3).

$$I_c = \frac{\lambda_{IREE} I_s}{w_m} \quad (3)$$

Alternatively, the Inverse Spin Hall Effect (ISHE) in metals such as tantalum (Ta), tungsten (W), or platinum (Pt) produces the horizontal charge current according to Equation (4).

$$I_c = \frac{\Theta_{SHE} t_{she} I_s}{2w_m} \quad (4)$$

Both IREE and ISHE effects produce spin to charge current conversion around 0.1 with existing materials at 10 nm magnet width. For scaled nanomagnets (e.g., 5 nm width) and exploratory SHE materials such as $Bi_2Se_3$, the spin to charge conversion efficiency can be between 1 and 2.5. The net conversion of the drive charge current to magnetization dependent charge current is provided by Equation (5), where P is the spin polarization.

$$I_c = \pm \frac{\lambda_{IREE} P I_d}{w_m} \text{ For IREE and } I_c = \pm \frac{\Theta_{SHE} t_{she} P I_d}{2w_m} \text{ for ISHE} \quad (5)$$

For this estimate the drive current and the signal charge current are set according to Equation (6).

$$I_c = I_d = 100 \text{ μA} \quad (6)$$

Estimating the resistance of the ISHE interface to be equal to R=100 Ω, then the induced voltage is according to Equation (7).

$$V_{ISHE} = 10 \text{ mV} \quad (7)$$

In an embodiment, detection mechanism and charge to spin conversion is achieved as described below. The charge current, as carried by an interconnect, produces a voltage on the capacitor including magnetoelectric material dielectric (such as bismuth ferric oxide (BFO) or $Cr_2O_3$) in contact with an output nanomagnet. The output nanomagnet serves as one of the plates of a capacitor. In one embodiment, magnetoelectric materials are either intrinsic multi-ferroics or composite multi-ferroic structures.

As the charge accumulates on the magnetoelectric capacitor, a strong magnetoelectric interaction causes the switching of magnetization in the output nanomagnet. Using the following parameters of the magnetoelectric capacitor: thickness $t_{ME}$=5 nm, dielectric constant ε=500, and area A=60 nm×20 nm, then the capacitance is as provided in Equation (8).

$$C = \frac{\varepsilon \varepsilon_0 A}{t_{ME}} \approx 1 fF \quad (8)$$

Demonstrated values of the magnetoelectric coefficient are as provided in Equation (9), where the speed of light is c.

$$B_{ME} = \alpha_{ME} E = \frac{\alpha_{ME} V_{ISHE}}{t_{ME}} \sim 0.06T \quad (9)$$

This translates to the effective magnetic field exerted on the nanomagnet as provided in Equation (10), which is a strong field sufficient to switch magnetization.

$$E_{sw} \sim 100 \text{ mV} * 100 \text{ μA} * 1 \text{ ps} \sim 10 \text{ aJ} \quad (10)$$

The charge on the capacitor Q is provided in Equation (11), and the time to fully charge it to the induced voltage is provided Equation (12) (with the account of decreased voltage difference as the capacitor charges).

$$Q = 1 \text{ fF} * 10 \text{ mV} = 10 \text{ aC} \quad (11)$$

$$t_d = 10 Q/I_d \sim 1 \text{ ps} \quad (12)$$

If the driving voltage is as provided in Equation (13), then the energy switch is as provided in Equation (14), which is comparable to the switching energy of CMOS transistors.

$$V_d = 100 \text{ mV} \quad (13)$$

$$E_{sw} \sim 100 \text{ mV} * 100 \text{ μA} * 1 \text{ ps} \sim 10 \text{ aJ} \quad (14)$$

It is to be appreciated that the time to switch magnetization remains much longer than the charging time and is determined by the magnetization precession rate. The micromagnetic simulations predict this time to be as provided in Equation (15).

$$t_{sw} \sim 100 \text{ ps} \quad (15)$$

Figure 3:
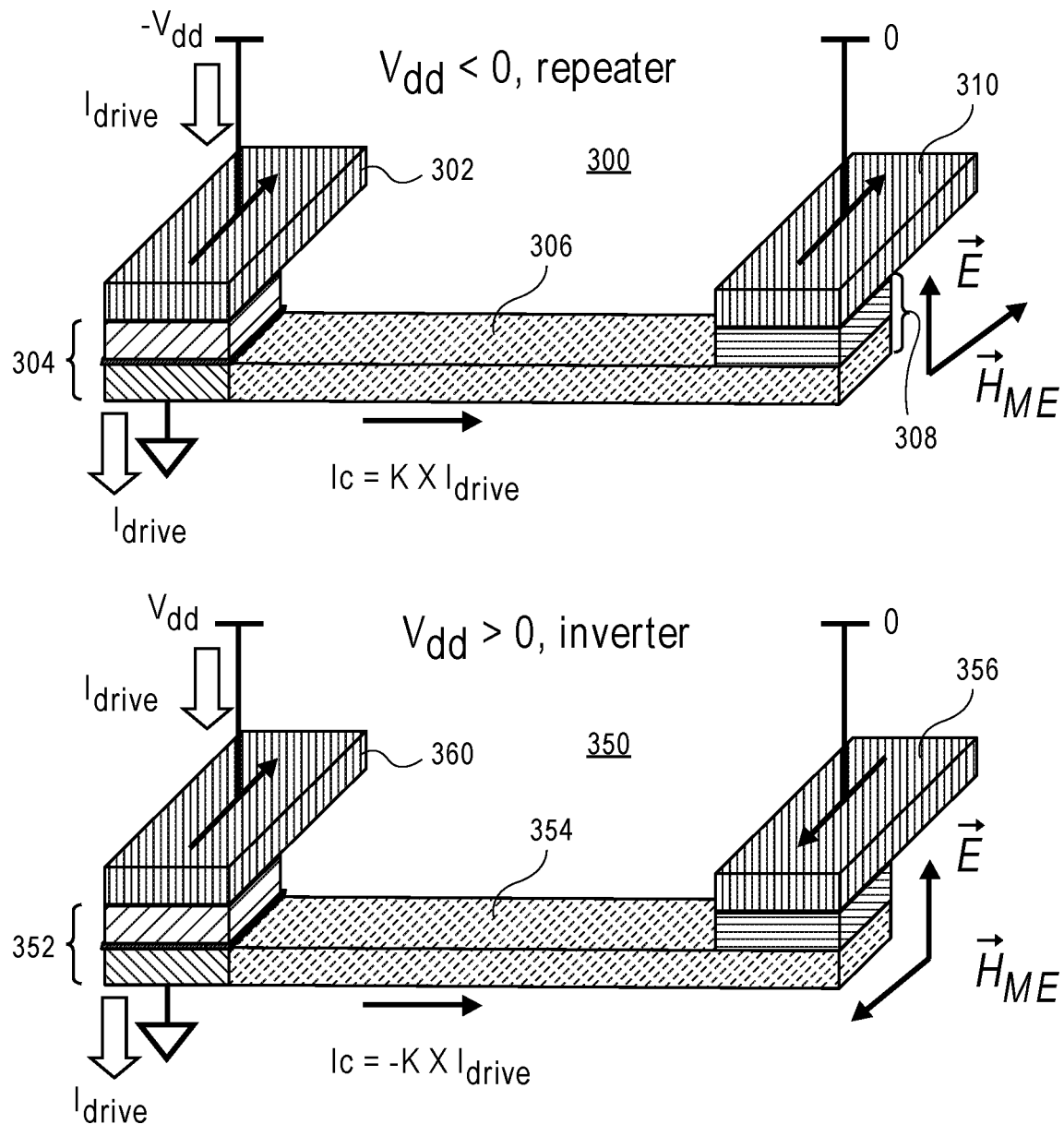
FIG. 3 includes schematics illustrating the operation of a spin-orbit logic (SOL) device as a logic invertor or repeater, in accordance with an embodiment of the present disclosure.

In an embodiment, a logic inverter and logic repeater operation is as described below. FIG. 3 includes schematics illustrating the operation of a spin-orbit logic (SOL) device as a logic invertor or repeater, in accordance with an embodiment of the present disclosure.

Referring to FIG. 3, a logic repeater operation works by injection of a spin current from a magnet 302 of a device 300. For $-V_{dd}$ supply voltage applied to the magnet 302 (e.g., an injector nanomagnet), a spin current having a direction of magnetization in the same direction as the nanomagnet is injected into a spin orbit effect stack 304. The spin orbit effect produces a charge current proportional to the injected spin current in a channel 306. The injected charge current charges a magnetoelectric stack 308 (negative on the top plate) producing a large effective magnetic field on a magnet 310 and magnetization the same as the input magnet. A logic inverter operation of a device 350 works by injection of a spin current from an input magnet 360 with a $+V_{dd}$ supply voltage. The injected spin current in a spin orbit effect stack 352 produces a charge current in a channel 354. The injected charge current charges a magnetoelectric stack with opposite sign of voltage (positive on top plate), producing a large effective magnetic field on a detector free layer or magnet 356 and the opposite magnetization to that on the input magnet.

Referring again to FIG. 3, the energy to regenerate the logic signal is derived from the power supply driving the charge current during the injector operation. In an embodiment, the logic repeater operation works by injection of a spin current from the input magnet. For −Vdd supply voltage applied to the injector nanomagnet, a spin current polarized in the same direction as the nanomagnet is injected into the high spin-orbit coupling (SOC) region. The SOC effects produce a charge current proportional to the injected spin current. The injected charge current charges a magnetoelectric stack producing a large effective magnetic field on the output magnet.

In an embodiment, the logic inverter operation works by injection of a spin current from the injector magnet with a +Vdd supply voltage. The injected charge current charges a magnetoelectric stack with opposite polarity, producing a large effective magnetic field on the detector free layer.

In an embodiment, unidirectionality of logic and cascadability is as described below. The SOL device provides logic cascadability and unidirectional signal propagation (i.e., input-output isolation). The unidirectional nature of logic is ensured due large difference in impedance for injection path versus detection path. The injector is essentially a metallic spin valve with spin to charge transduction with resistance area (RA) products of approximately 10 mOhm·micron$^2$. The detection path is a low leakage capacitance with RA products significantly greater than 1 MOhm·micron$^2$ in series with the resistance of the ferromagnetic (FM) capacitor plate with estimated resistance greater than 500 Ohms.

Figure 4:
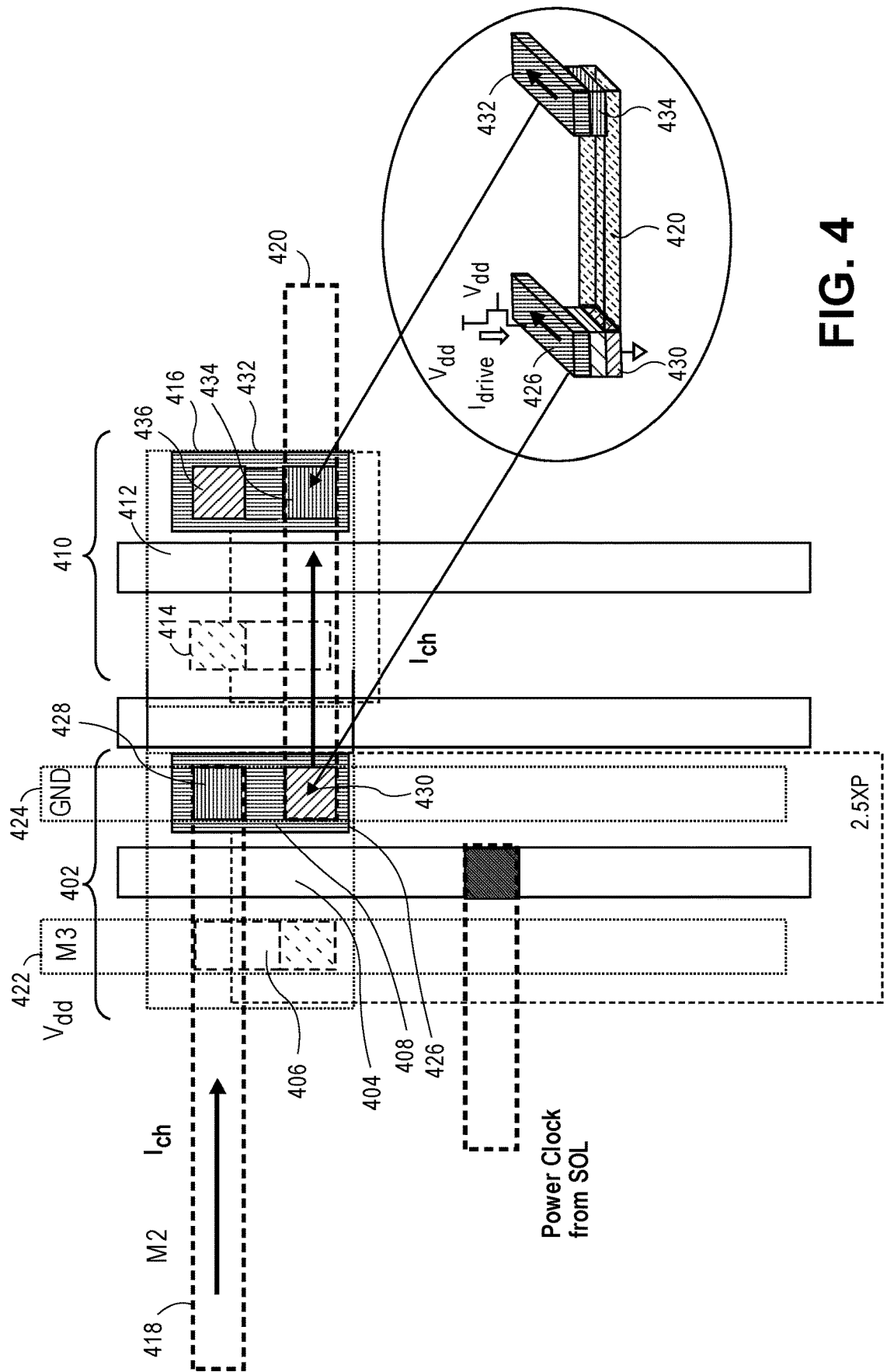
FIG. 4 is a schematic illustrating CMOS integration of a spin-orbit logic (SOL) device, in accordance with an embodiment of the present disclosure.

In an embodiment, CMOS Integration for power delivery and clocked power supply is as described below. The SOL device provides high integration density with CMOS drive and control transistors. As an exemplary integration scheme for a logic inverter stage, FIG. 4 is a schematic illustrating CMOS integration of a spin-orbit logic (SOL) device, in accordance with an embodiment of the present disclosure. It is to be appreciated that CMOS drivers can be essential as power supplies as well as to provide clocked power to control the logic.

Referring to FIG. 4, a scheme 400 includes a transistor 402 including a gate electrode 404 and a junction region 406 (e.g., source region) and a junction region 408 (e.g., drain region). Also illustrated is a transistor 410 including a gate electrode 412, a junction region 414 and a junction region 416. A metal interconnect line 418 is connected to junction region 408 of transistor 402, and a metal interconnect line 420 (representatively at the same level as interconnect line 418) is connected to junction region 408 and junction region 416. An interconnect line 422 and an interconnect line 424 (each representatively at a different level than interconnect line 418 and interconnect line 420) are connected to junction region 406 and junction region 408, respectively to provide power and ground.

FIG. 4 illustrates the incorporation of a spin orbit logic (SOL) device into scheme 400. As shown, the device includes two magnets each with two landing regions. Junction region 408 includes a magnet 426 connected at one end to a magnetoelectric material 428 and at an opposite end to a spin orbit effect stack 430 (including a material that will exhibit a spin orbit effect in a metallic system (a IREE or spin Hall effect material)). Scheme 400 also includes a magnet 432 connected at one end to a magnetoelectric material 434 and at an opposite end to a spin orbit effect stack 436. Interconnect line 418 is connected to magnetoelectric material 428 (to form a capacitor), and interconnect line 420 is connected to spin orbit effect stack 430 and to magnetoelectric material 434. In operation, a charge current introduced on interconnect line 418 switches a direction of magnetization of magnet 426 and injects a spin current in magnet 426 that is converted to a charge current in interconnect line 420 that switches a direction of magnetization of magnet 432.

In an embodiment, relatively high logic density is achieved using the integration scheme of the device with CMOS drivers for power supply and clocking as illustrated in FIG. 4. In one embodiment, the density of integration of the devices exceeds that of CMOS since an inverter operation can be achieved within 2.5PX2M0. In one embodiment, since the power transistor can be shared among all the devices at the same clock phases, vertical integration can also be used to increase the logic density.

In an embodiment, majority gate operation is as described below. A charge mediated majority gate is based on the spin orbit coupling and magneto-electric switching. As an example, FIG. 5 illustrates a charge mediated majority gate, in accordance with an embodiment of the present disclosure.

Figure 5:
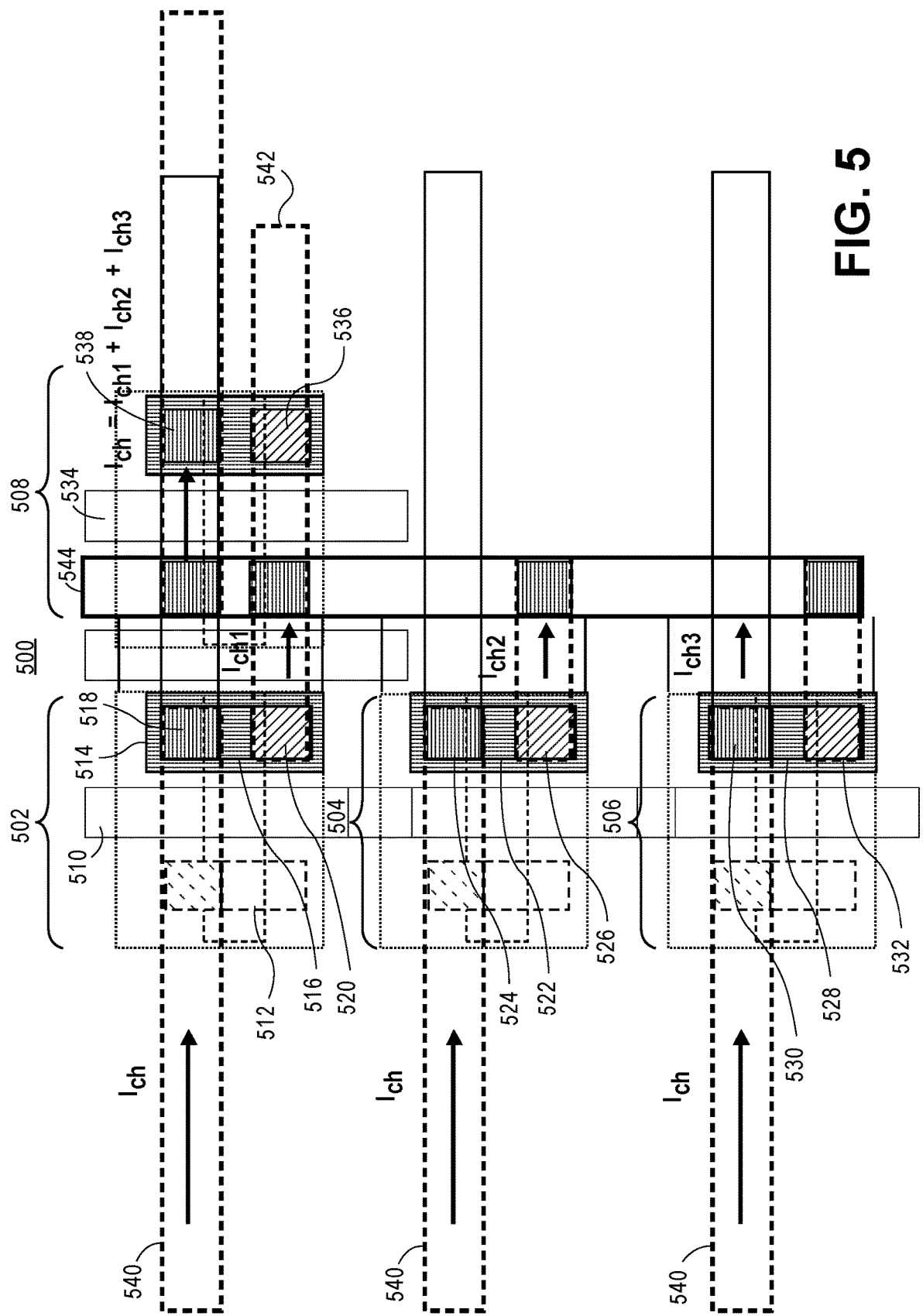
FIG. 5 illustrates a charge mediated majority gate, in accordance with an embodiment of the present disclosure.

Referring to FIG. 5, a scheme 500 includes a transistor 502, a transistor 504 and transistor 506 as inputs, and a transistor 508 as an output. Transistor 502 includes gate electrode 510, a source region 512 and a drain region 514. Disposed in (deposited on or otherwise connected to) drain region is a magnet 516 connected at one end to an magnetoelectric material 518 and at another end to a spin orbit effect stack 520. Transistor 504 similarly includes a source region and drain region with the drain region including a magnet 522 coupled at one end to a magnetoelectric material 524 and at another end to a spin orbit effect stack 526. Transistor 506 similarly includes a source region and drain region with the drain region including a magnet 528 coupled at one end to a magnetoelectric material 530 and at another end to a spin orbit effect stack 532. Transistor 508 includes a gate electrode 534 and source and drain regions with the drain region including a magnet connected at one end to a spin orbit effect stack 536 and at another end to a magnetoelectric material 538.

An interconnect line 540 (shown as three separate lines) is connected to each of magnetoelectric material 518, magnetoelectric material 524 and magnetoelectric material 530 of transistor 502, transistor 504 and transistor 506, respectively. An interconnect line 542 is shown connected to spin orbit effect stack 520 of transistor 502 and to spin orbit effect stack 536. In one embodiment, interconnect line 540 and interconnect line 542 are on a same level. An interconnect line 544 is perpendicular to interconnect line 540 and, in one embodiment, on another level than interconnect line 540 and interconnect line 540. Interconnect line 544 is connected to each of the spin orbit effect stack 520, 526 and 532 of respective transistors 502, 504 and 506 and to spin orbit effect stack 536 of transistor 508. In one embodiment, a charge current carries the information of the magnet beneath it (the charge current will have a direction of current flow depending on a magnet orientation that is representative of a logic state). In the embodiment of FIG. 5, the charge current into each of transistor 502, 504 and 506 (Ich) will produce a charge current ($I_{ch1}$, $I_{ch2}$ and $I_{ch3}$, respectively) that represents an input to the transistor 508. For a logic operation, each of $I_{ch1}$, $I_{ch2}$, and $I_{ch3}$ is 0 or 1 and transistor 508 will receive the majority output of the input transistors (either 0 or 1 depending on whether there are more Os than is among $I_{ch1}$, $I_{ch2}$ and $I_{ch3}$).

Referring again to FIG. 5, the three input stages share a common power/clock region. As such, the power/clock gating transistor can be shared among the three inputs of the majority gate. The input stages can also be stacked vertically to improve the logic density. Accordingly, a charge mediated majority gate can be formed using SOL devices. The input devices share a power/clock zone and can share the same power/clock transistor.

In an embodiment, a magnetic state element is as described below. State elements can be essential for clocked logic operation for synchronous and asynchronous (event driven) computing. In one embodiment, the unique nature of spin orbit logic where the interconnect is charge based provides the ability to create state machines using the CMOS transistors. As an example, FIG. 6 include a table and a schematic illustrating a state machine using SOL with CMOS integration, in accordance with an embodiment, of the present disclosure.

Figure 6:
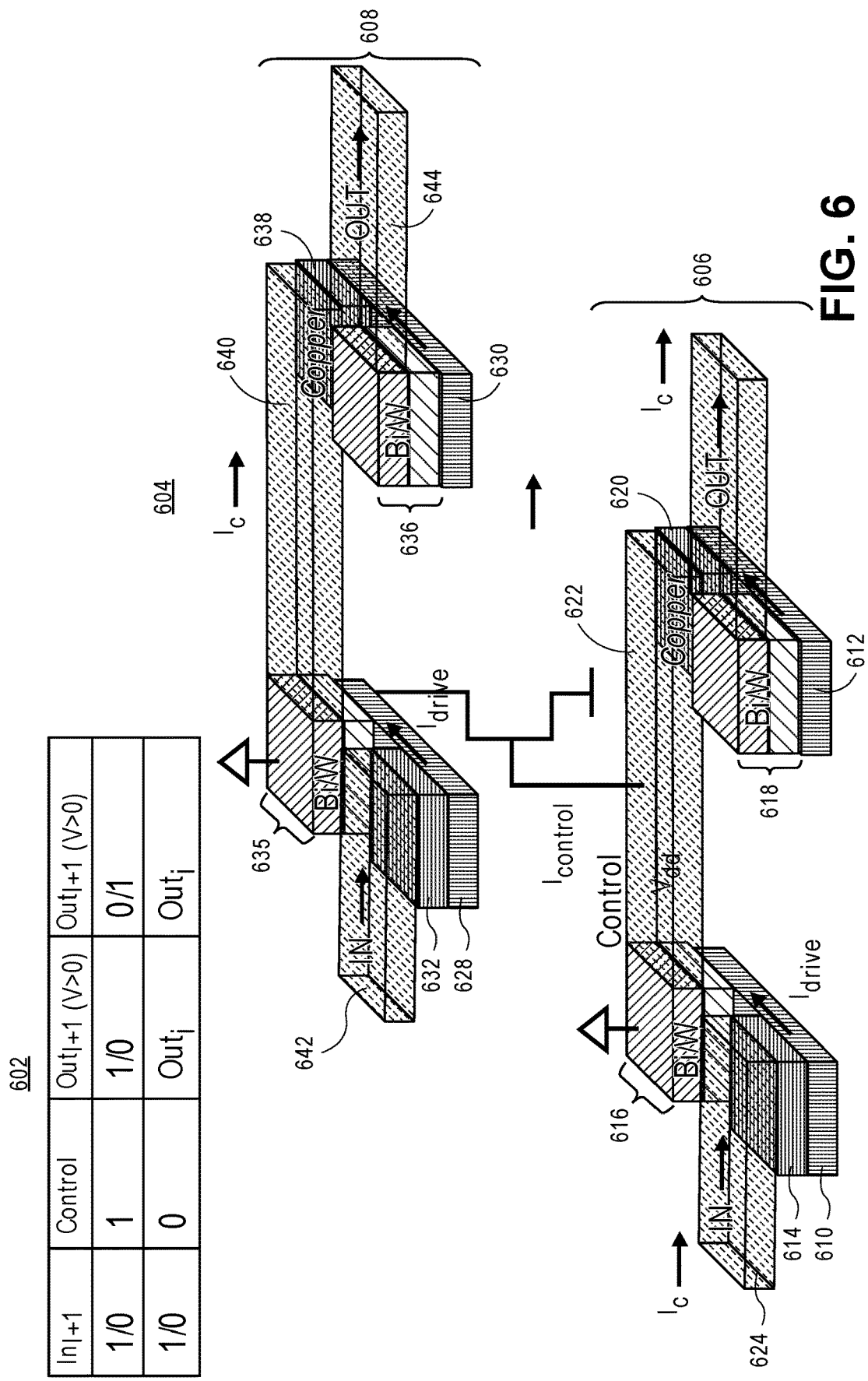
FIG. 6 includes a table and a schematic illustrating a state machine using SOL with CMOS integration, in accordance with an embodiment, of the present disclosure.

Table 602 of FIG. 6 shows a representative truth table for a state element operation. If a control is 1, an output either follows the control (1) or is the inverse of the control (0). If a control is 0, the output will not respond to the control but will hold its previous state.

Referring again to FIG. 6, an assembly 604 includes SOL device 606 and SOL device 608. SOL device 606, in this embodiment, is a control logic. SOL device 606 includes a magnet 610 and a magnet 612. Deposited on a surface of magnet 610 at one end is a magnetoelectric material 614 and, at another end, a spin orbit effect stack 616. Deposited on a surface of magnet 612 at one end is a magnetoelectric material 618 and, at another end, a spin orbit effect stack 620. An interconnect or channel 622 is connected between spin orbit effect stack 616 of magnet 610 and magnetoelectric material 620 of magnet 612. Interconnect 624 is connected to magnetoelectric material 614 on magnet 610, and interconnect 626 is connected to spin orbit effect stack 618 on magnet 612. Representatively, an input current ($I_c$) on interconnect 624 produces a voltage on magnetoelectric material 614 to control magnet 610, and then drive current (spin current) in magnet 610 that is converted to a charge current or control current ($I_{control}$) in interconnect 622.

In one embodiment, SOL device 608 is a repeater. SOL device 608 includes a magnet 628 and a magnet 630. Deposited on a surface of magnet 628 at one end is a magnetoelectric material 632 and, at another end, a spin orbit effect stack 634. Deposited on a surface of magnet 630 at one end is a spin orbit effect stack 636 and, at another end, a magnetoelectric material 638. An interconnect or channel 640 is connected between spin orbit effect stack 634 of magnet 628 and magnetoelectric material 638 of magnet 630. An interconnect 642 is connected to magnetoelectric material 632 on magnet 628, and an interconnect 644 is connected to spin orbit effect stack 636 on magnet 630. When SOL device 608 power is ON (i.e., drive current is flowing), the device functions as a repeater representatively receiving an input current on interconnect 642 and a charge current is repeated on interconnect 644. Such input current produces a drive current (spin current) in magnet 628 that is converted to a charge current in interconnect 640 that controls the direction of magnetization of magnet 630. The power to turn SOL device 608 ON is controlled with SOL device 606. SOL device 606 is connected to SOL device 608 and will produce a charge signal to turn power to device 608 ON or OFF.

Embodiments disclosed herein may be used to manufacture a wide variety of different types of integrated circuits and/or microelectronic devices. Examples of such integrated circuits include, but are not limited to, processors, chipset components, graphics processors, digital signal processors, micro-controllers, and the like. In other embodiments, semiconductor memory may be manufactured. Moreover, the integrated circuits or other microelectronic devices may be used in a wide variety of electronic devices known in the art. For example, in computer systems (e.g., desktop, laptop, server), cellular phones, personal electronics, etc. The integrated circuits may be coupled with a bus and other components in the systems. For example, a processor may be coupled by one or more buses to a memory, a chipset, etc. Each of the processor, the memory, and the chipset, may potentially be manufactured using the approaches disclosed herein.

Figure 7:
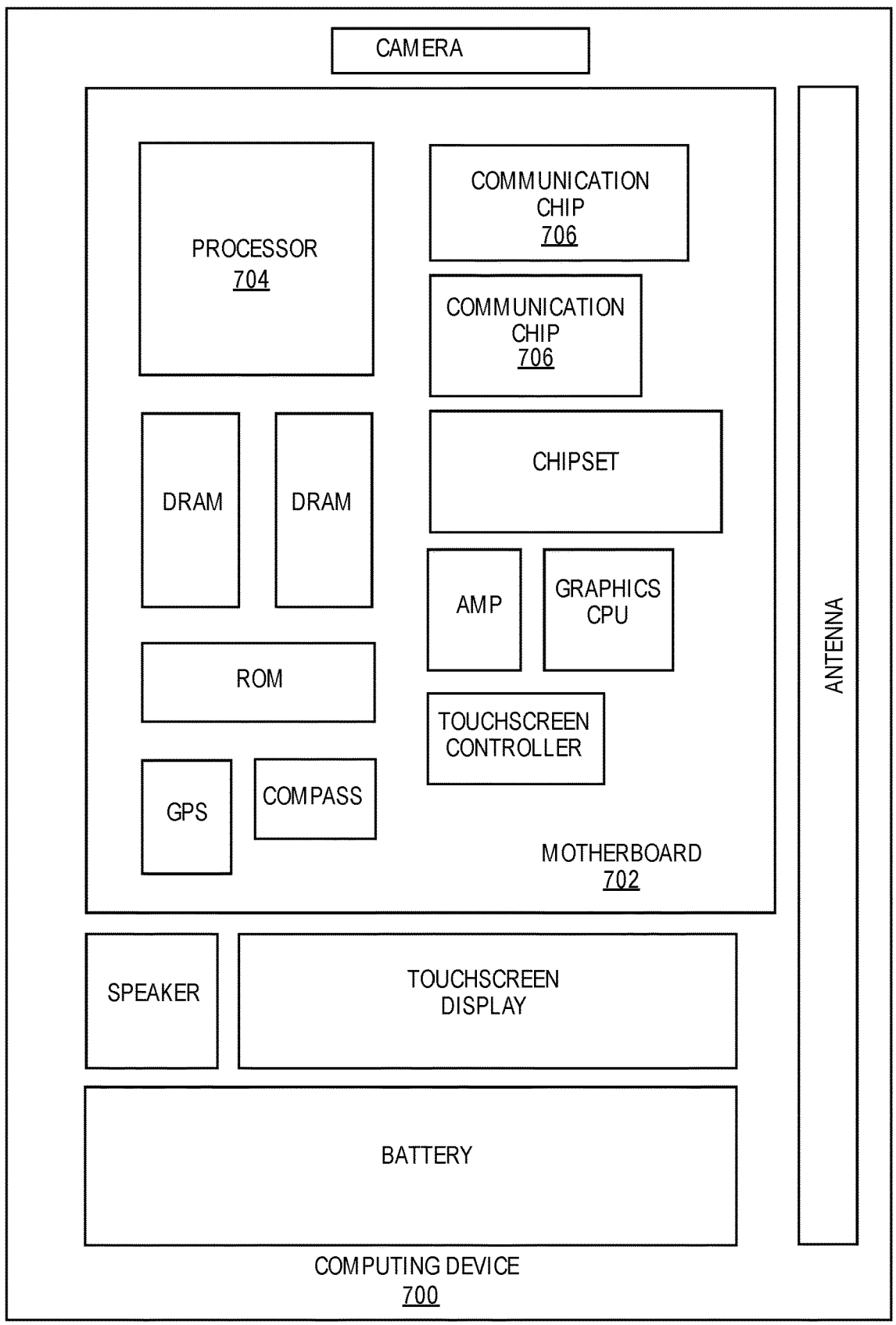
FIG. 7 illustrates a computing device in accordance with one implementation of an embodiment of the disclosure.

FIG. 7 illustrates a computing device 700 in accordance with one implementation of an embodiment of the disclosure. The computing device 700 houses a board 702. The board 702 may include a number of components, including but not limited to a processor 704 and at least one communication chip 706. The processor 704 is physically and electrically coupled to the board 702. In some implementations the at least one communication chip 706 is also physically and electrically coupled to the board 702. In further implementations, the communication chip 706 is part of the processor 704.

Depending on its applications, computing device 700 may include other components that may or may not be physically and electrically coupled to the board 702. These other components include, but are not limited to, volatile memory (e.g., DRAM), non-volatile memory (e.g., ROM), flash memory, a graphics processor, a digital signal processor, a crypto processor, a chipset, an antenna, a display, a touchscreen display, a touchscreen controller, a battery, an audio codec, a video codec, a power amplifier, a global positioning system (GPS) device, a compass, an accelerometer, a gyroscope, a speaker, a camera, and a mass storage device (such as hard disk drive, compact disk (CD), digital versatile disk (DVD), and so forth).

The communication chip 706 enables wireless communications for the transfer of data to and from the computing device 700. The term "wireless" and its derivatives may be used to describe circuits, devices, systems, methods, techniques, communications channels, etc., that may communicate data through the use of modulated electromagnetic radiation through a non-solid medium. The term does not imply that the associated devices do not contain any wires, although in some embodiments they might not. The communication chip 706 may implement any of a number of wireless standards or protocols, including but not limited to Wi-Fi (IEEE 802.11 family), WiMAX (IEEE 802.16 family), IEEE 802.20, long term evolution (LTE), Ev-DO, HSPA+, HSDPA+, HSUPA+, EDGE, GSM, GPRS, CDMA, TDMA, DECT, Bluetooth, derivatives thereof, as well as any other wireless protocols that are designated as 3G, 4G, 5G, and beyond. The computing device 700 may include a plurality of communication chips 706. For instance, a first communication chip 706 may be dedicated to shorter range wireless communications such as Wi-Fi and Bluetooth and a second communication chip 706 may be dedicated to longer range wireless communications such as GPS, EDGE, GPRS, CDMA, WiMAX, LTE, Ev-DO, and others.

The processor 7604 of the computing device 700 includes an integrated circuit die packaged within the processor 704. In some implementations of embodiments of the disclosure, the integrated circuit die of the processor includes one or more devices, such as magneto-electric spin orbital devices, built in accordance with implementations of embodiments of the disclosure. The term "processor" may refer to any device or portion of a device that processes electronic data from registers and/or memory to transform that electronic data into other electronic data that may be stored in registers and/or memory.

The communication chip 706 also includes an integrated circuit die packaged within the communication chip 706. In accordance with another implementation of an embodiment of the disclosure, the integrated circuit die of the communication chip includes one or more devices, such as magneto-electric spin orbital devices, in accordance with embodiments of the disclosure.

In further implementations, another component housed within the computing device 700 may contain an integrated circuit die that includes one or more devices, such as magneto-electric spin orbital devices, in accordance with embodiments of the disclosure.

In various implementations, the computing device 700 may be a laptop, a netbook, a notebook, an ultrabook, a smartphone, a tablet, a personal digital assistant (PDA), an ultra mobile PC, a mobile phone, a desktop computer, a server, a printer, a scanner, a monitor, a set-top box, an entertainment control unit, a digital camera, a portable music player, or a digital video recorder. In further implementations, the computing device 700 may be any other electronic device that processes data.

Figure 8:
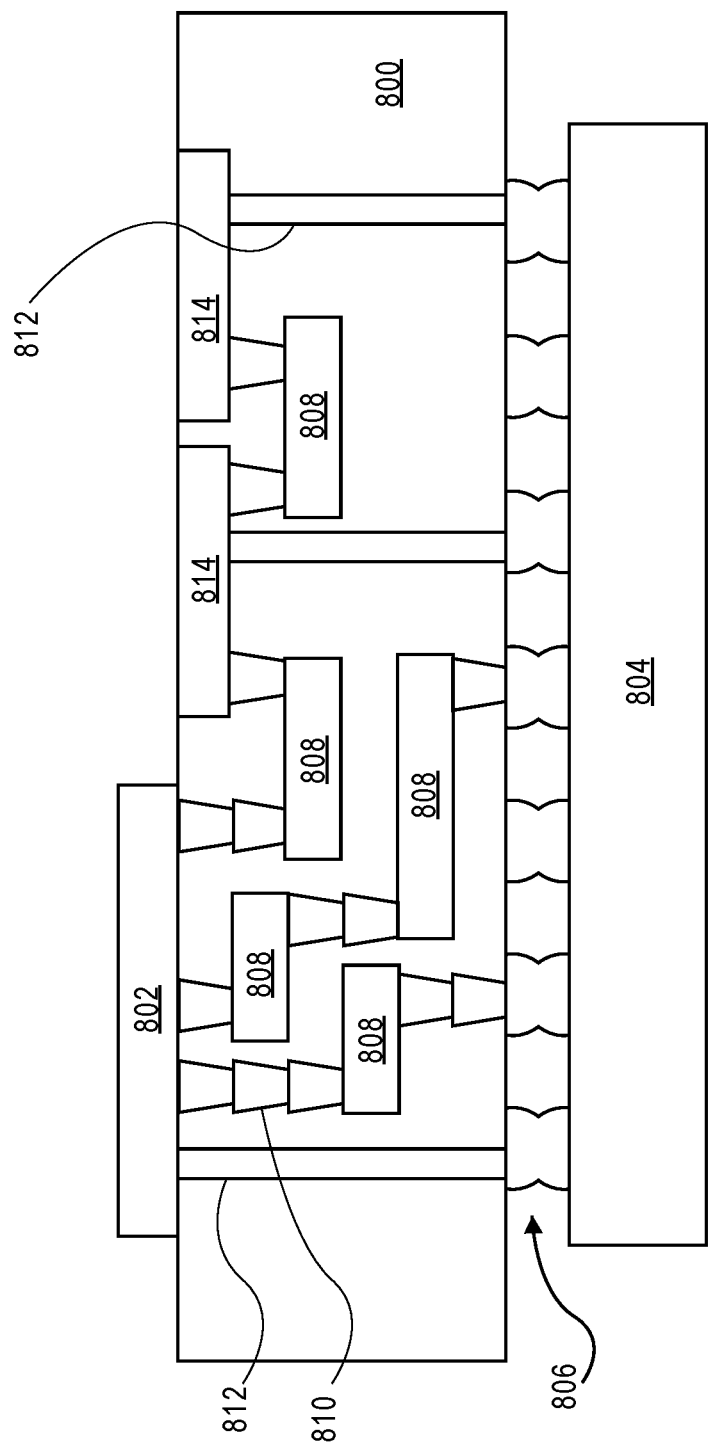
FIG. 8 is an interposer implementing one or more embodiments of the disclosure.

FIG. 8 illustrates an interposer 800 that includes one or more embodiments of the disclosure. The interposer 800 is an intervening substrate used to bridge a first substrate 802 to a second substrate 804. The first substrate 802 may be, for instance, an integrated circuit die. The second substrate 804 may be, for instance, a memory module, a computer motherboard, or another integrated circuit die. Generally, the purpose of an interposer 800 is to spread a connection to a wider pitch or to reroute a connection to a different connection. For example, an interposer 800 may couple an integrated circuit die to a ball grid array (BGA) 806 that can subsequently be coupled to the second substrate 804. In some embodiments, the first and second substrates 802/804 are attached to opposing sides of the interposer 800. In other embodiments, the first and second substrates 802/804 are attached to the same side of the interposer 800. And in further embodiments, three or more substrates are interconnected by way of the interposer 800.

The interposer 800 may be formed of an epoxy resin, a fiberglass-reinforced epoxy resin, a ceramic material, or a polymer material such as polyimide. In further implementations, the interposer may be formed of alternate rigid or flexible materials that may include the same materials described above for use in a semiconductor substrate, such as silicon, germanium, and other group rI-V and group IV materials.

The interposer may include metal interconnects 808 and vias 810, including but not limited to through-silicon vias (TSVs) 812. The interposer 800 may further include embedded devices 814, including both passive and active devices. Such devices include, but are not limited to, capacitors, decoupling capacitors, resistors, inductors, fuses, diodes, transformers, sensors, and electrostatic discharge (ESD) devices. More complex devices such as radio-frequency (RF) devices, power amplifiers, power management devices, antennas, arrays, sensors, and MEMS devices may also be formed on the interposer 800. In accordance with embodiments of the disclosure, apparatuses or processes disclosed herein may be used in the fabrication of interposer 800 or in one or more of the components of the interposer 800.

Thus, embodiments of the present disclosure include magneto-electric spin orbital (MESO) structures having functional oxide vias, and method of fabricating magneto-electric spin orbital (MESO) structures having functional oxide vias.

Example Embodiment 1

A magneto-electric spin orbital (MESO) device includes a source region and a drain region in or above a substrate. A first via contact is on the source region. A second via contact is on the drain region, the second via contact laterally adjacent to the first via contact. A plurality of alternating ferromagnetic material lines and non-ferromagnetic conductive lines is above the first and second via contacts. A first of the ferromagnetic material lines is on the first via contact, and a second of the ferromagnetic material lines is on the second via contact. A spin orbit coupling (SOC) via is on the first of the ferromagnetic material lines. A functional oxide via is on the second of the ferromagnetic material lines.

Example Embodiment 2

The MESO device of example embodiment 1, further including a conductive line on and coupling the SOC via and the functional oxide via.

Example Embodiment 3

The MESO device of example embodiment 2, wherein the conductive line runs orthogonal to the non-ferromagnetic conductive lines of the plurality of alternating ferromagnetic material lines and non-ferromagnetic conductive lines.

Example Embodiment 4

The MESO device of example embodiment 1, 2 or 3, further including a third via contact on the drain region, the third via contact coupled to an overlying non-ferromagnetic conductive line of the a plurality of alternating ferromagnetic material lines and non-ferromagnetic conductive lines.

Example Embodiment 5

The MESO device of example embodiment 1, 2, 3 or 4, wherein the source and drain regions are in a first inter-layer dielectric (ILD) layer, the first and second via contacts are in a second ILD layer above the first ILD layer, the plurality of alternating ferromagnetic material lines and non-ferromagnetic conductive lines is in a third ILD layer above the second ILD layer, and the SOC via and the functional oxide via are in a fourth ILD layer above the third ILD layer.

Example Embodiment 6

The MESO device of example embodiment 1, 2, 3, 4 or 5, wherein the functional oxide via includes a magnetoelectric dielectric material selected from the group consisting of bismuth ferrite (BFO), chromium (III) oxide ($Cr_2O_3$) and magnesium oxide (MgO).

Example Embodiment 7

The MESO device of example embodiment 1, 2, 3, 4, 5 or 6, wherein the SOC via includes a non-magnetic metal material selected from the group consisting of silver (Ag), aluminum (Al), gold (Au) and copper (Cu), and the SOC via further includes a material that exhibits a spin orbit effect, with an interface between the non-magnetic metal material and material that exhibits the spin orbit effect.

Example Embodiment 8

The MESO device of example embodiment 1, 2, 3, 4, 5, 6 or 7, wherein the ferromagnetic material lines include a material selected from the group consisting of Co, Fe, Ni, Gd.

Example Embodiment 9

The MESO device of example embodiment 1, 2, 3, 4, 5, 6 or 7, wherein the ferromagnetic material lines include a Huesler alloy of the form $X_2YZ$ or XYZ where X, Y, Z are elements selected from the group consisting of Co, Fe, Ni, Al, Ge, Ga, Gd, and Mn.

Example Embodiment 10

A method of fabricating a magneto-electric spin orbital (MESO) device includes forming a source region and a drain region in a first dielectric layer above a substrate. First and second via contacts are formed in first and second openings of a second dielectric layer formed above the first dielectric layer, the first via contact formed on the source region, and the second via contact formed on a first portion of the drain region. A third via contact is formed in a third opening of the second dielectric layer, the third via contact formed on a second portion of the drain region different than the first portion of the drain region. A plurality of alternating ferromagnetic material lines and non-ferromagnetic conductive lines is formed in a plurality of corresponding trenches formed in a third dielectric layer formed above the second dielectric layer. A first of the ferromagnetic material lines is formed on the first via contact, a second of the ferromagnetic material lines is formed on the second via contact, and a first of the non-ferromagnetic conductive lines is formed on the third via contact. A spin orbit coupling (SOC) via is formed in a first opening formed in a fourth dielectric layer formed above the third dielectric layer, the SOC via formed on the first of the ferromagnetic material lines. A functional oxide via is formed in a second opening in the fourth dielectric layer, the functional oxide via formed on the second of the ferromagnetic material lines. A conductive line is formed in a trench formed in a fifth dielectric layer above the fourth dielectric layer, the conductive line formed on and coupling the SOC via and the functional oxide via. The trench formed in the fifth dielectric layer runs orthogonal to the plurality of corresponding trenched formed in the third dielectric layer.

Example Embodiment 11

The method of example embodiment 10, wherein the first and second via contacts are formed using a photobucket approach in a sacrificial hardmask layer formed above the second dielectric layer.

Example Embodiment 12

The method of example embodiment 10 or 11, wherein the third via contact is formed using a photobucket approach in a sacrificial hardmask layer formed above the second dielectric layer.

Example Embodiment 13

The method of example embodiment 10, 11 or 12, wherein the SOC via is formed using a photobucket approach in a sacrificial hardmask layer formed above the fourth dielectric layer.

Example Embodiment 14

The method of example embodiment 10, 11, 12 or 13, wherein the functional oxide via is formed using a photobucket approach in a sacrificial hardmask layer formed above the fourth dielectric layer.

Example Embodiment 15

The method of example embodiment 10, 11, 12, 13 or 14, wherein forming the functional oxide via includes forming a magnetoelectric dielectric material selected from the group consisting of bismuth ferrite (BFO), chromium (II) oxide ($Cr_2O_3$) and magnesium oxide (MgO).

Example Embodiment 16

The method of example embodiment 10, 11, 12, 13, 14 or 15, wherein forming the SOC via includes forming a non-magnetic metal material selected from the group consisting of silver (Ag), aluminum (Al), gold (Au) and copper (Cu), and forming a material that exhibits a spin orbit effect, with an interface between the non-magnetic metal material and material that exhibits the spin orbit effect.

Example Embodiment 17

The method of example embodiment 10, 11, 12, 13, 14, 15 or 16, wherein forming the ferromagnetic material lines includes forming a material selected from the group consisting of Co, Fe, Ni and Gd.

Example Embodiment 18

The method of example embodiment 10, 11, 12, 13, 14, 15 or 16, wherein forming the ferromagnetic material lines includes forming a Huesler alloy of the form $X_2YZ$ or XYZ where X, Y, Z are elements selected from the group consisting of Co, Fe, Ni, Al, Ge, Ga, Gd, and Mn.

Example Embodiment 19

A method of fabricating a magneto-electric spin orbital (MESO) device includes forming a source region and a drain region in a first dielectric layer above a substrate. A first via contact is formed in a first opening of a second dielectric layer formed above the first dielectric layer, the first via contact formed on the source region. A second via contact is formed in a second opening of the second dielectric layer, the second via contact formed on a first portion of the drain region. Locations of the first and second openings of the second dielectric layer are selected using a first photobucket process. A third via contact is formed in a third opening of the second dielectric layer, the third via contact formed on a second portion of the drain region different than the first portion of the drain region. A location of the third opening of the second dielectric layer is selected using a second photobucket process. A plurality of alternating ferromagnetic material lines and non-ferromagnetic conductive lines is formed in a plurality of corresponding trenches formed in a third dielectric layer formed above the second dielectric layer. A first of the ferromagnetic material lines is formed on the first via contact, a second of the ferromagnetic material lines is formed on the second via contact, and a first of the non-ferromagnetic conductive lines is formed on the third via contact. A spin orbit coupling (SOC) via is formed in a first opening formed in a fourth dielectric layer formed above the third dielectric layer, the SOC via formed on the first of the ferromagnetic material lines. A location of the first opening of the fourth dielectric layer is selected using a third photobucket process. A functional oxide via is formed in a second opening in the fourth dielectric layer, the functional oxide via formed on the second of the ferromagnetic material lines. A location of the second opening of the fourth dielectric layer is selected using a fourth photobucket process. A conductive line is formed in a trench formed in a fifth dielectric layer above the fourth dielectric layer. The conductive line is formed on and couples the SOC via and the functional oxide via. The trench formed in the fifth dielectric layer runs orthogonal to the plurality of corresponding trenched formed in the third dielectric layer.

Example Embodiment 20

The method of example embodiment 19, wherein forming the functional oxide via includes forming a magnetoelectric dielectric material selected from the group consisting of bismuth ferrite (BFO), chromium (III) oxide ($Cr_2O_3$) and magnesium oxide (MgO).

Example Embodiment 21

The method of example embodiment 19 or 20, wherein forming the SOC via includes forming a non-magnetic metal material selected from the group consisting of silver (Ag), aluminum (Al), gold (Au) and copper (Cu), and forming a material that exhibits a spin orbit effect, with an interface between the non-magnetic metal material and material that exhibits the spin orbit effect.

Example Embodiment 22

The method of example embodiment 19, 20 or 21, wherein forming the ferromagnetic material lines includes forming a material selected from the group consisting of Co, Fe, Ni and Gd.

Example Embodiment 23

The method of example embodiment 19, 20 or 21, wherein forming the ferromagnetic material lines includes forming a Huesler alloy of the form $X_2YZ$ or XYZ where X, Y, Z are elements selected from the group consisting of Co, Fe, Ni, Al, Ge, Ga, Gd, and Mn.

What is claimed is:
1. A magneto-electric spin orbital (MESO) device, comprising:
   a source region and a drain region in or above a substrate;
   a first via contact on the source region;
   a second via contact on the drain region, the second via contact laterally adjacent to the first via contact;
   a plurality of alternating ferromagnetic material lines and non-ferromagnetic conductive lines above the first and second via contacts, wherein a first of the ferromagnetic material lines is on the first via contact, and a second of the ferromagnetic material lines is on the second via contact;
   a spin orbit coupling (SOC) via on the first of the ferromagnetic material lines; and
   a functional oxide via on the second of the ferromagnetic material lines.
2. The MESO device of claim 1, further comprising:
   a conductive line on and coupling the SOC via and the functional oxide via.
3. The MESO device of claim 2, wherein the conductive line runs orthogonal to the non-ferromagnetic conductive lines of the plurality of alternating ferromagnetic material lines and non-ferromagnetic conductive lines.
4. The MESO device of claim 1, further comprising:
   a third via contact on the drain region, the third via contact coupled to an overlying non-ferromagnetic conductive line of the a plurality of alternating ferromagnetic material lines and non-ferromagnetic conductive lines.
5. The MESO device of claim 1, wherein the source and drain regions are in a first inter-layer dielectric (ILD) layer, the first and second via contacts are in a second ILD layer above the first ILD layer, the plurality of alternating ferromagnetic material lines and non-ferromagnetic conductive lines is in a third ILD layer above the second ILD layer, and the SOC via and the functional oxide via are in a fourth ILD layer above the third ILD layer.
6. The MESO device of claim 1, wherein the functional oxide via comprises a magnetoelectric dielectric material selected from the group consisting of bismuth ferrite (BFO), chromium (Im) oxide ($Cr_2O_3$) and magnesium oxide (MgO).
7. The MESO device of claim 1, wherein the SOC via comprises a non-magnetic metal material selected from the group consisting of silver (Ag), aluminum (Al), gold (Au) and copper (Cu), and the SOC via further comprises a material that exhibits a spin orbit effect, with an interface between the non-magnetic metal material and material that exhibits the spin orbit effect.
8. The MESO device of claim 1, wherein the ferromagnetic material lines comprise a material selected from the group consisting of Co, Fe, Ni and Gd.
9. The MESO device of claim 1, wherein the ferromagnetic material lines comprise a Huesler alloy of the form $X_2YZ$ or XYZ where X, Y, Z are elements selected from the group consisting of Co, Fe, Ni, Al, Ge, Ga, Gd, and Mn.
10. A method of fabricating a magneto-electric spin orbital (MESO) device, the method comprising:
   forming a source region and a drain region in a first dielectric layer above a substrate;
   forming first and second via contacts in first and second openings of a second dielectric layer formed above the first dielectric layer, the first via contact formed on the source region, and the second via contact formed on a first portion of the drain region;
   forming a third via contact in a third opening of the second dielectric layer, the third via contact formed on a second portion of the drain region different than the first portion of the drain region;
   forming a plurality of alternating ferromagnetic material lines and non-ferromagnetic conductive lines in a plurality of corresponding trenches formed in a third dielectric layer formed above the second dielectric layer, wherein a first of the ferromagnetic material lines is formed on the first via contact, and a second of the ferromagnetic material lines is formed on the second via contact, and wherein a first of the non-ferromagnetic conductive lines is formed on the third via contact;
   forming a spin orbit coupling (SOC) via in a first opening formed in a fourth dielectric layer formed above the third dielectric layer, the SOC via formed on the first of the ferromagnetic material lines;

forming a functional oxide via in a second opening in the fourth dielectric layer, the functional oxide via formed on the second of the ferromagnetic material lines; and forming a conductive line in a trench formed in a fifth dielectric layer above the fourth dielectric layer, the conductive line formed on and coupling the SOC via and the functional oxide via, wherein the trench formed in the fifth dielectric layer runs orthogonal to the plurality of corresponding trenched formed in the third dielectric layer.

11. The method of claim 10, wherein the first and second via contacts are formed using a photobucket approach in a sacrificial hardmask layer formed above the second dielectric layer.

12. The method of claim 10, wherein the third via contact is formed using a photobucket approach in a sacrificial hardmask layer formed above the second dielectric layer.

13. The method of claim 10, wherein the SOC via is formed using a photobucket approach in a sacrificial hardmask layer formed above the fourth dielectric layer.

14. The method of claim 10, wherein the functional oxide via is formed using a photobucket approach in a sacrificial hardmask layer formed above the fourth dielectric layer.

15. The method of claim 10, wherein forming the functional oxide via comprises forming a magnetoelectric dielectric material selected from the group consisting of bismuth ferrite (BFO), chromium (III) oxide ($Cr_2O_3$) and magnesium oxide (MgO).

16. The method of claim 10, wherein forming the SOC via comprises forming a non-magnetic metal material selected from the group consisting of silver (Ag), aluminum (Al), gold (Au) and copper (Cu), and forming a material that exhibits a spin orbit effect, with an interface between the non-magnetic metal material and material that exhibits the spin orbit effect.

17. The method of claim 10, wherein forming the ferromagnetic material lines comprises forming a material selected from the group consisting of Co, Fe, Ni and Gd.

18. The method of claim 10, wherein forming the ferromagnetic material lines comprises forming a Huesler alloy of the form $X_2YZ$ or XYZ where X, Y, Z are elements selected from the group consisting of Co, Fe, Ni, Al, Ge, Ga, Gd, and Mn.

19. A method of fabricating a magneto-electric spin orbital (MESO) device, the method comprising:

forming a source region and a drain region in a first dielectric layer above a substrate;

forming a first via contact in a first opening of a second dielectric layer formed above the first dielectric layer, the first via contact formed on the source region;

forming a second via contact in a second opening of the second dielectric layer, the second via contact formed on a first portion of the drain region, wherein locations of the first and second openings of the second dielectric layer are selected using a first photobucket process;

forming a third via contact in a third opening of the second dielectric layer, the third via contact formed on a second portion of the drain region different than the first portion of the drain region, wherein a location of the third opening of the second dielectric layer is selected using a second photobucket process;

forming a plurality of alternating ferromagnetic material lines and non-ferromagnetic conductive lines in a plurality of corresponding trenches formed in a third dielectric layer formed above the second dielectric layer, wherein a first of the ferromagnetic material lines is formed on the first via contact, and a second of the ferromagnetic material lines is formed on the second via contact, and wherein a first of the non-ferromagnetic conductive lines is formed on the third via contact;

forming a spin orbit coupling (SOC) via in a first opening formed in a fourth dielectric layer formed above the third dielectric layer, the SOC via formed on the first of the ferromagnetic material lines, wherein a location of the first opening of the fourth dielectric layer is selected using a third photobucket process;

forming a functional oxide via in a second opening in the fourth dielectric layer, the functional oxide via formed on the second of the ferromagnetic material lines, wherein a location of the second opening of the fourth dielectric layer is selected using a fourth photobucket process, and forming a conductive line in a trench formed in a fifth dielectric layer above the fourth dielectric layer, the conductive line formed on and coupling the SOC via and the functional oxide via, wherein the trench formed in the fifth dielectric layer runs orthogonal to the plurality of corresponding trenched formed in the third dielectric layer.

20. The method of claim 19, wherein forming the functional oxide via comprises forming a magnetoelectric dielectric material selected from the group consisting of bismuth ferrite (BFO), chromium (III) oxide ($Cr_2O_3$) and magnesium oxide (MgO).

21. The method of claim 19, wherein forming the SOC via comprises forming a non-magnetic metal material selected from the group consisting of silver (Ag), aluminum (Al), gold (Au) and copper (Cu), and forming a material that exhibits a spin orbit effect, with an interface between the non-magnetic metal material and material that exhibits the spin orbit effect.

22. The method of claim 19, wherein forming the ferromagnetic material lines comprises forming a material selected from the group consisting of Co, Fe, Ni and Gd.

23. The method of claim 19, wherein forming the ferromagnetic material lines comprises forming a Huesler alloy of the form $X_2YZ$ or XYZ where X, Y, Z are elements selected from the group consisting of Co, Fe, Ni, Al, Ge, Ga, Gd, and Mn.

* * * * *